(12) United States Patent
Brodsky et al.

(10) Patent No.: US 10,172,232 B2
(45) Date of Patent: Jan. 1, 2019

(54) TAMPER-RESPONDENT ASSEMBLIES WITH ENCLOSURE-TO-BOARD PROTECTION

(71) Applicant: INTERNATIONAL BUSINESS MACHINES CORPORATION, Armonk, NY (US)

(72) Inventors: William L. Brodsky, Binghamton, NY (US); James A. Busby, New Paltz, NY (US); Edward N. Cohen, Poughkeepsie, NY (US); Silvio Dragone, Winterthur (CH); Michael J. Fisher, Poughkeepsie, NY (US); David C. Long, Wappingers Falls, NY (US); Michael T. Peets, Staatsburg, NY (US); William Santiago-Fernandez, Poughkeepsie, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/827,275

(22) Filed: Nov. 30, 2017

(65) Prior Publication Data

US 2018/0098423 A1    Apr. 5, 2018

Related U.S. Application Data

(63) Continuation of application No. 15/423,833, filed on Feb. 3, 2017, now Pat. No. 9,877,383, which is a
(Continued)

(51) Int. Cl.
*G08B 21/00*   (2006.01)
*H05K 1/02*    (2006.01)
(Continued)

(52) U.S. Cl.
CPC ......... *H05K 1/0275* (2013.01); *G08B 13/128* (2013.01); *H05K 1/0216* (2013.01);
(Continued)

(58) Field of Classification Search
CPC ............ G08B 13/1445; G08B 13/1463; G08B 13/14; B32B 3/04; G01R 11/04; G01R 11/24
(Continued)

(56) References Cited

U.S. PATENT DOCUMENTS 3,165,569 A    1/1965   Bright et al.
4,160,503 A    7/1979   Ohlbach
(Continued)

FOREIGN PATENT DOCUMENTS

CN    2014-30639 Y    3/2010
CN    10-4346587 A    2/2015
(Continued)

OTHER PUBLICATIONS

Holm, Ragnar, "Electric Contacts: Theory and Application", Spinger-Verlag, New York, 4th Edition, 1981 (pp. 10-19).
(Continued)

*Primary Examiner* — Joseph Feild
*Assistant Examiner* — Sharmin Akhter
(74) *Attorney, Agent, or Firm* — Tihon Poltavets, Esq.; Kevin P. Radigan, Esq.; Heslin Rothenberg Farley & Mesiti P.C.

(57) ABSTRACT

Tamper-respondent assemblies and fabrication methods are provided which incorporate enclosure to circuit board protection. The tamper-respondent assemblies include a circuit board, and an electronic enclosure mounted to the circuit board and facilitating enclosing at least one electronic component within a secure volume. A tamper-respondent electronic circuit structure facilitates defining the secure volume, and the tamper-respondent electronic circuit structure includes a tamper-respondent circuit. An adhesive is provided to secure, in part, the electronic enclosure to the circuit board. The adhesive contacts, at least in part, the
(Continued)

tamper-respondent circuit so that an attempted separation of the electronic enclosure from the circuit board causes the adhesive to break the tamper-respondent circuit, facilitating detection of the separation by a monitor circuit of the tamper-respondent electronic circuit structure.

13 Claims, 16 Drawing Sheets

Related U.S. Application Data continuation of application No. 15/193,525, filed on Jun. 27, 2016, now Pat. No. 9,661,747, which is a continuation of application No. 14/974,036, filed on Dec. 18, 2015, now Pat. No. 9,554,477.

(51) Int. Cl.
*H05K 5/02* (2006.01)
*H05K 1/18* (2006.01)
*G08B 13/12* (2006.01)
*H05K 3/22* (2006.01)
*H05K 1/11* (2006.01)

(52) U.S. Cl.
CPC ............... *H05K 1/181* (2013.01); *H05K 3/22* (2013.01); *H05K 5/0208* (2013.01); *H05K 1/112* (2013.01); *H05K 2201/10151* (2013.01); *H05K 2201/10265* (2013.01); *H05K 2201/10371* (2013.01)

(58) Field of Classification Search
USPC ......... 340/568.2, 539.31, 649–653; 428/121, 428/124, 125, 126, 128, 245, 915, 916; 361/654, 672
See application file for complete search history.

(56) References Cited

U.S. PATENT DOCUMENTS

| | | | |
|---|---|---|---|
| 4,211,324 A | 7/1980 | Ohlback | |
| 4,324,823 A | 4/1982 | Ray, III | |
| 4,516,679 A | 5/1985 | Simpson | |
| 4,496,900 A | 6/1985 | Di Stefano et al. | |
| 4,593,384 A | 6/1986 | Kleinjne | |
| 4,609,104 A | 9/1986 | Kasper et al. | |
| 4,653,252 A | 3/1987 | Van de Haar et al. | |
| 4,677,809 A | 7/1987 | Long et al. | |
| 4,691,350 A | 9/1987 | Kleijne et al. | |
| 4,807,284 A | 2/1989 | Kleijne | |
| 4,811,288 A | 3/1989 | Kleijne et al. | |
| 4,860,351 A | 8/1989 | Weingart | |
| 4,865,197 A | 9/1989 | Craig | |
| 5,009,311 A | 4/1991 | Schenk | |
| 5,027,397 A | 6/1991 | Double et al. | |
| 5,060,114 A | 10/1991 | Feinberg et al. | |
| 5,075,822 A | 12/1991 | Baumler et al. | |
| 5,117,457 A | 5/1992 | Comerford et al. | |
| 5,159,629 A | 10/1992 | Double et al. | |
| 5,185,717 A | 2/1993 | Mori | |
| 5,201,868 A | 4/1993 | Johnson | |
| 5,201,879 A | 4/1993 | Steele et al. | |
| 5,211,618 A | 5/1993 | Stoltz | |
| 5,239,664 A | 8/1993 | Verrier et al. | |
| 5,389,738 A | 2/1995 | Piosenka et al. | |
| 5,406,630 A | 4/1995 | Piosenka et al. | |
| 5,506,566 A | 4/1996 | Oldfield et al. | |
| 5,568,124 A | 10/1996 | Joyce et al. | |
| 5,594,439 A | 1/1997 | Swanson | |
| 5,675,319 A | 10/1997 | Rivenberg et al. | |
| 5,715,652 A | 2/1998 | Stahlecker | |
| 5,761,054 A | 6/1998 | Kuhn | |
| 5,813,113 A | 9/1998 | Stewart et al. | |
| 5,858,500 A * | 1/1999 | MacPherson | E05G 1/14 264/259 |
| 5,880,523 A | 3/1999 | Cadelore | |
| 5,988,510 A | 11/1999 | Tuttle et al. | |
| 6,121,544 A | 9/2000 | Petsinger | |
| 6,195,267 B1 | 2/2001 | MacDonald, Jr. et al. | |
| 6,201,296 B1 | 3/2001 | Fries et al. | |
| 6,233,339 B1 | 5/2001 | Kawano et al. | |
| 6,259,363 B1 | 7/2001 | Payne | |
| 6,261,215 B1 | 7/2001 | Imer | |
| 6,301,096 B1 | 10/2001 | Wozniczka | |
| 6,384,397 B1 | 5/2002 | Takiar et al. | |
| 6,420,971 B1 | 7/2002 | Leck et al. | |
| 6,424,954 B1 | 7/2002 | Leon | |
| 6,438,825 B1 | 8/2002 | Kuhm | |
| 6,469,625 B1 | 10/2002 | Tomooka | |
| 6,473,995 B2 | 11/2002 | Miyakawa et al. | |
| 6,512,454 B2 | 1/2003 | Miglioli et al. | |
| 6,686,539 B2 | 2/2004 | Farquhar et al. | |
| 6,746,960 B2 | 6/2004 | Goodman et al. | |
| 6,798,660 B2 | 9/2004 | Moss et al. | |
| 6,817,204 B2 | 11/2004 | Bash et al. | |
| 6,853,093 B2 | 2/2005 | Cohen et al. | |
| 6,879,032 B2 | 4/2005 | Rosenau et al. | |
| 6,929,900 B2 | 8/2005 | Farquhar et al. | |
| 6,946,960 B2 | 9/2005 | Sisson et al. | |
| 6,957,345 B2 | 10/2005 | Cesana et al. | |
| 6,970,360 B2 | 11/2005 | Sinha | |
| 6,985,362 B2 | 1/2006 | Mori et al. | |
| 6,991,961 B2 | 1/2006 | Hubbard et al. | |
| 6,996,953 B2 | 2/2006 | Perreault et al. | |
| 7,005,733 B2 | 2/2006 | Kommerling et al. | |
| 7,015,823 B1 | 5/2006 | Gillen et al. | |
| 7,054,162 B2 | 5/2006 | Benson et al. | |
| 7,057,896 B2 | 6/2006 | Matsuo et al. | |
| 7,094,143 B2 | 8/2006 | Wolm et al. | |
| 7,094,459 B2 | 8/2006 | Takahashi | |
| 7,095,615 B2 | 8/2006 | Nichols | |
| 7,156,233 B2 | 1/2007 | Clark et al. | |
| 7,180,008 B2 | 2/2007 | Heitmann et al. | |
| 7,189,360 B1 | 3/2007 | Ho et al. | |
| 7,214,874 B2 | 5/2007 | Dangler et al. | |
| 7,247,791 B2 | 7/2007 | Kulpa | |
| 7,304,373 B2 | 12/2007 | Taggart et al. | |
| 7,310,737 B2 | 12/2007 | Patel et al. | |
| 7,465,887 B2 | 12/2008 | Suzuki et al. | |
| 7,475,474 B2 | 1/2009 | Heitmann et al. | |
| 7,515,418 B2 | 4/2009 | Straznicky et al. | |
| 7,549,064 B2 | 6/2009 | Elbert et al. | |
| 7,640,658 B1 | 1/2010 | Pham et al. | |
| 7,643,290 B1 | 1/2010 | Narasimhan et al. | |
| 7,663,883 B2 | 2/2010 | Shirakami et al. | |
| 7,672,129 B1 | 3/2010 | Ouyang et al. | |
| 7,731,517 B2 | 6/2010 | Lee et al. | |
| 7,746,657 B2 | 6/2010 | Oprea et al. | |
| 7,760,086 B2 | 7/2010 | Hunter et al. | |
| 7,768,005 B2 | 8/2010 | Condorelli et al. | |
| 7,783,994 B2 | 8/2010 | Ball et al. | |
| 7,787,256 B2 | 8/2010 | Chan et al. | |
| 7,868,411 B2 | 1/2011 | Eaton et al. | |
| 7,898,413 B2 | 3/2011 | Hsu et al. | |
| 7,901,977 B1 | 3/2011 | Angelopoulos et al. | |
| 7,947,911 B1 | 5/2011 | Pham et al. | |
| 7,978,070 B2 | 7/2011 | Hunter | |
| 8,006,101 B2 * | 8/2011 | Crawford | G06F 21/72 380/46 |
| 8,084,855 B2 | 12/2011 | Lower et al. | |
| 8,094,450 B2 | 1/2012 | Cole et al. | |
| 8,133,621 B2 | 3/2012 | Wormald et al. | |
| 8,101,267 B2 | 6/2012 | Moh et al. | |
| 8,199,506 B2 | 6/2012 | Janik et al. | |
| 8,287,336 B2 | 10/2012 | Dangler et al. | |
| 8,325,486 B2 | 12/2012 | Arshad et al. | |
| 8,345,423 B2 | 1/2013 | Campbell et al. | |
| 8,516,269 B1 | 8/2013 | Hamlet et al. | |
| 8,589,703 B2 | 11/2013 | Lee et al. | |
| 8,646,108 B2 | 2/2014 | Shiakallis et al. | |
| 8,659,506 B2 | 2/2014 | Nomizo | |
| 8,659,908 B2 | 2/2014 | Adams et al. | |

(56) References Cited

U.S. PATENT DOCUMENTS

| | | | |
|---|---|---|---|
| 8,664,047 B2 | 3/2014 | Lower et al. | |
| 8,716,606 B2 | 5/2014 | Kelley et al. | |
| 8,797,059 B2 | 8/2014 | Boday et al. | |
| 8,836,509 B2 | 9/2014 | Lowy | |
| 8,853,839 B2 * | 10/2014 | Gao | H01L 29/66007 257/676 |
| 8,879,266 B2 | 11/2014 | Jarvis et al. | |
| 8,890,298 B2 | 11/2014 | Buer et al. | |
| 8,947,889 B2 | 2/2015 | Kelley et al. | |
| 8,961,280 B2 | 2/2015 | Dangler et al. | |
| 9,003,199 B2 | 4/2015 | Dellmo et al. | |
| 9,011,762 B2 | 4/2015 | Seppa et al. | |
| 9,052,070 B2 | 6/2015 | Davis et al. | |
| 9,166,586 B2 | 10/2015 | Carapelli et al. | |
| 9,298,956 B2 | 3/2016 | Wade et al. | |
| 9,554,036 B1 | 1/2017 | Brodsky et al. | |
| 9,555,606 B1 | 1/2017 | Fisher et al. | |
| 9,560,737 B2 | 1/2017 | Isaacs et al. | |
| 9,578,764 B1 | 2/2017 | Fisher et al. | |
| 9,591,776 B1 | 3/2017 | Brodsky et al. | |
| 9,661,747 B1 | 5/2017 | Brodsky et al. | |
| 9,717,154 B2 | 7/2017 | Brodsky et al. | |
| 2001/0050425 A1 | 12/2001 | Beroz et al. | |
| 2001/0056542 A1 | 12/2001 | Cesana et al. | |
| 2002/0002683 A1 | 1/2002 | Benson | |
| 2002/0068384 A1 | 6/2002 | Beroz et al. | |
| 2002/0084090 A1 | 7/2002 | Farquhar | |
| 2003/0009684 A1 | 1/2003 | Schwenck et al. | |
| 2005/0068735 A1 | 3/2005 | Fissore et al. | |
| 2005/0111194 A1 | 5/2005 | Sohn et al. | |
| 2005/0180104 A1 | 8/2005 | Olesen et al. | |
| 2006/0034731 A1 | 2/2006 | Lewis et al. | |
| 2006/0072288 A1 | 4/2006 | Stewart et al. | |
| 2006/0196945 A1 | 9/2006 | Mendels | |
| 2006/0218779 A1 | 10/2006 | Ooba et al. | |
| 2007/0064396 A1 | 3/2007 | Oman et al. | |
| 2007/0064399 A1 | 3/2007 | Mandel et al. | |
| 2007/0108619 A1 | 5/2007 | Hsu | |
| 2007/0211436 A1 | 9/2007 | Robinson et al. | |
| 2007/0223165 A1 | 9/2007 | Itri et al. | |
| 2007/0230127 A1 | 10/2007 | Peugh et al. | |
| 2007/0268671 A1 | 11/2007 | Brandenburg et al. | |
| 2008/0050512 A1 | 2/2008 | Lower et al. | |
| 2008/0144290 A1 | 6/2008 | Brandt et al. | |
| 2008/0159539 A1 | 7/2008 | Huang et al. | |
| 2008/0160274 A1 | 7/2008 | Dang et al. | |
| 2008/0191174 A1 | 8/2008 | Ehrensvard et al. | |
| 2008/0251906 A1 | 10/2008 | Eaton et al. | |
| 2009/0073659 A1 | 3/2009 | Peng et al. | |
| 2009/0166065 A1 | 7/2009 | Clayton et al. | |
| 2010/0088528 A1 | 4/2010 | Sion | |
| 2010/0110647 A1 | 5/2010 | Hiew et al. | |
| 2010/0134959 A1 | 6/2010 | Fife et al. | |
| 2010/0177487 A1 | 7/2010 | Arshad et al. | |
| 2010/0319986 A1 | 12/2010 | Bleau et al. | |
| 2011/0001237 A1 | 1/2011 | Brun et al. | |
| 2011/0038123 A1 | 2/2011 | Janik et al. | |
| 2011/0103027 A1 | 5/2011 | Aoki et al. | |
| 2011/0241446 A1 | 10/2011 | Tucholski | |
| 2011/0299244 A1 | 12/2011 | Dede et al. | |
| 2012/0050998 A1 | 3/2012 | Klum et al. | |
| 2012/0117666 A1 | 5/2012 | Oggioni et al. | |
| 2012/0140421 A1 | 6/2012 | Kirstine et al. | |
| 2012/0319986 A1 | 6/2012 | Toh et al. | |
| 2012/0185636 A1 | 7/2012 | Leon et al. | |
| 2012/0244742 A1 | 9/2012 | Wertz et al. | |
| 2012/0256305 A1 | 10/2012 | Kaufmann et al. | |
| 2012/0320529 A1 | 12/2012 | Loong et al. | |
| 2013/0033818 A1 | 2/2013 | Hosoda et al. | |
| 2013/0104252 A1 | 4/2013 | Yanamadala et al. | |
| 2013/0141137 A1 | 6/2013 | Krutzik et al. | |
| 2013/0158936 A1 | 6/2013 | Rich et al. | |
| 2013/0170217 A1 | 7/2013 | Lee | |
| 2013/0208422 A1 | 8/2013 | Hughes et al. | |
| 2013/0235527 A1 | 9/2013 | Wagner et al. | |
| 2013/0283386 A1 | 10/2013 | Lee | |
| 2014/0022733 A1 | 1/2014 | Lim et al. | |
| 2014/0160679 A1 | 6/2014 | Kelty et al. | |
| 2014/0184263 A1 | 7/2014 | Ehrenpfordt et al. | |
| 2014/0204533 A1 | 7/2014 | Abeyasekera et al. | |
| 2014/0321064 A1 | 10/2014 | Bose et al. | |
| 2014/0325688 A1 | 10/2014 | Cashin et al. | |
| 2015/0007427 A1 | 1/2015 | Dangler et al. | |
| 2015/0163933 A1 * | 6/2015 | Steiner | H05K 5/0208 174/50.51 |
| 2015/0235053 A1 | 8/2015 | Lee et al. | |
| 2016/0005262 A1 | 1/2016 | Hirato et al. | |
| 2016/0012693 A1 | 1/2016 | Sugar | |
| 2016/0137548 A1 | 5/2016 | Cabral, Jr. et al. | |
| 2016/0262253 A1 | 9/2016 | Isaacs et al. | |
| 2016/0262270 A1 | 9/2016 | Isaacs et al. | |
| 2017/0019987 A1 | 1/2017 | Dragone et al. | |
| 2017/0089729 A1 | 3/2017 | Brodsky et al. | |
| 2017/0089977 A1 | 3/2017 | Warnock et al. | |
| 2017/0091491 A1 | 3/2017 | Dangler et al. | |
| 2017/0091492 A1 | 3/2017 | Brodsky et al. | |
| 2017/0094778 A1 | 3/2017 | Brodsky et al. | |
| 2017/0094783 A1 | 3/2017 | Dangler et al. | |
| 2017/0094784 A1 | 3/2017 | Brodsky et al. | |
| 2017/0094803 A1 | 3/2017 | Dangler et al. | |
| 2017/0094804 A1 | 3/2017 | Brodsky et al. | |
| 2017/0094805 A1 | 3/2017 | Dangler et al. | |
| 2017/0094806 A1 | 3/2017 | Brodsky et al. | |
| 2017/0094808 A1 | 3/2017 | Brodsky et al. | |
| 2017/0094820 A1 | 3/2017 | Brodsky et al. | |
| 2017/0094847 A1 | 3/2017 | Fisher et al. | |
| 2017/0108543 A1 | 4/2017 | Brodsky et al. | |
| 2017/0111998 A1 | 4/2017 | Brodsky et al. | |
| 2017/0116830 A1 | 4/2017 | Isaacs et al. | |
| 2017/0156223 A1 | 6/2017 | Fisher et al. | |
| 2017/0171999 A1 | 6/2017 | Fisher et al. | |
| 2017/0249813 A1 | 8/2017 | Busby et al. | |
| 2017/0316228 A1 | 11/2017 | Campbell et al. | |
| 2017/0330844 A1 | 11/2017 | Busby et al. | |
| 2017/0332485 A1 | 11/2017 | Busby et al. | |

FOREIGN PATENT DOCUMENTS

| | | |
|---|---|---|
| DE | 19816571 A1 | 10/1999 |
| DE | 19816572 A1 | 10/1999 |
| DE | 10-2012-203955 | 9/2013 |
| EP | 0 056 360 A1 | 10/1993 |
| EP | 0 629 497 A2 | 12/1994 |
| EP | 1 184 773 A1 | 3/2002 |
| EP | 1 207 444 A2 | 5/2002 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | 61-297035 A | 12/1986 |
| JP | 2000-238141 A | 9/2000 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | WO 2013/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/0189483 A1 | 12/2013 |
| WO | WO 2014/086987 A2 | 6/2014 |
| WO | WO 2014/158159 A1 | 10/2014 |

OTHER PUBLICATIONS

Clark, Andrew J., "Physical Protection of Cryptographic Devices", Advanced in Cyprtology, Eurocrypt '87, Springer, Berlin Heidelberg (1987) (11 pages).

(56) References Cited

OTHER PUBLICATIONS

Halperin et al., "Latent Open Testing of Electronic Packaging", MCMC-194, IEEE (1994) (pp. 83-33).
Simek, Bob, "Tamper Restrictive Thermal Ventilation System for Enclosures Requiring Ventilation and Physical Security", IBM Publication No. IPCOM000008607D, Mar. 1, 1998 (2 pages).
Pamula et al., "Cooling of Integrated Circuits Using Droplet-Based Microfluidics", Association for Computing Machinery (ACM), GLSVLSI'03, Apr. 28-29, 2003 (pp. 84-87).
Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).
Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).
Drimer et al., "Thinking Inside the Box: System-Level Failures of Tamper Proofing", 2008 IEEE Symposium on Security and Privacy, (Feb. 2008) (pp. 281-295).
Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).
Sample et al., "Design of an RFID-Based Battery-Free Programmable Sensing Platform", IEEE Transactions on Instrumentation and Measurement, vol. 57, No. 11, Nov. 2008 (pp. 2608-2615).
Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).
Anonymous, "Consolidated Non-Volatile Memory in a Chip Stack", IBM Technical Disclosure: IP.com No. IPCOM000185250, Jul. 16, 2009 (6 pages).
Isaacs et al., "Tamper Proof, Tamper Evident Encryption Technology", Pan Pacific Symposium SMTA Proceedings (2013) (9 pages).
Anonymous, "Selective Memory Encryption", IBM Technical Disclosure: IP.com IPCOM000244183, Nov. 20, 2015 (6 pages).
Zhou et al., "Nonlinear Analysis for Hardware Trojan Detection", ICSPCC2015, IEEE (2015) (4 pages).
Harting Mitronics, "Safety Caps for Payment Terminals", http://harting-mitronics/ch/fileadmin/hartingmitronics/case_studies/Safety_caps_for_payment_terminals.pdf, downloaded Aug. 2016 (2 pages).
Gold Phoenix Printed Circuit Board, "Why multilayer pcb is used so widely?", May 7, 2012, accessed online @ [http://www.goldphoenixpcb.com/html/Support_Resource/others/arc_110.html] on Feb. 15, 2017.

Busby et al., "Tamper-Respondent Assembly with Nonlinearity Monitoring", U.S. Appl. No. 15/194,738, filed Jun. 28, 2016 (48 pages).
Dragone et al., "Tamper-Respondent Assembly with Sensor Connection Adapter", U.S. Appl. No. 15/268,959, filed Sep. 19, 2016 (45 pages).
Dragone et al., "Vented Tamper-Respondent Assemblies", U.S. Appl. No. 15/275,748, filed Sep. 26, 2016 (53 pages).
Dragone et al., "Tamper-Respondent Assemblies with in Situ Vent Structure(s)", U.S. Appl. No. 15/275,762, filed Sep. 26, 2016 (72 pages).
Buby et al., "Tamper-Respondent Assemblies with Trace Regions of Increased Susceptibility to Breaking", U.S. Appl. No. 15/341,108, filed Nov. 2, 2016 (56 pages).
Brodsky et al., "Tamper-Respondent Assembly with Flexible Tamper-Detect Sensor(s) Overlying In-Situ-Formed Tamper-Detect Sensor", U.S. Appl. No. 15/430,842, filed Feb. 13, 2017 (61 pages).
Busby et al., "Multi-Layer Stack with Embedded Tamper-Detect Protection", U.S. Appl. No. 15/791,642, filed Oct. 24, 2017 (67 pages).
Brodsky et al., "Tamper-Respondent Assemblies", U.S. Appl. No. 15/800,497, filed Nov. 1, 2017 (108 pages).
Brodsky et al., "Overlapping, Discrete Tamper-Respondent Sensors", U.S. Appl. No. 15/819,540, filed Nov. 21, 2017 (111 pages).
Busby et al., "Tamper-Respondent Assembly with Nonlinearity Monitoring", U.S. Appl. No. 15/820,620, filed Nov. 22, 2017 (49 pages).
Busby et al., "Tamper-Proof Electronic Packages Formed with Stressed Glass", U.S. Appl. No. 15/831,534, filed Dec. 5, 2017 (45 pages).
Busby et al, "Tamper-Proof Electronic Packages with Stressed Glass Component Substrate(s)", U.S. Appl. No. 15/831,554, filed Dec. 5, 2017 (56 pages).
Brodsky et al., "Tamper-Respondent Assemblies with Bond Protection", U.S. Appl. No. 15/835,557, filed Dec. 8, 2017 (111 pages).
Brodsky et al., "Tamper-Respondent Assemblies with Bond Protection", U.S. Appl. No. 15/835,569, filed Dec. 8, 2017 (108 pages).
Fisher et al., "Enclosure with Inner Tamper-Respondent Sensor(s) and Physical Security Element(s)", U.S. Appl. No. 15/835,585, filed Dec. 8, 2017 (113 pages).
Cambpell et al., "Tamper-Proof Electronic Packages with Two-Phase Dielectric Fluid", U.S. Appl. No. 15/836,958, filed Dec. 11, 2017 (60 pages).
Fisher et al., "Tamper-Respondent Assembly with Vent Structure", U.S. Appl. No. 15/836,966, filed Dec. 11, 2017 (61 pages).
Brodsky et al., "List of IBM Patents and Patent Applications Treated as Related", U.S. Appl. No. 15/827,275, filed Nov. 30, 2017, dated Dec. 18, 2017 (2 pages).

* cited by examiner

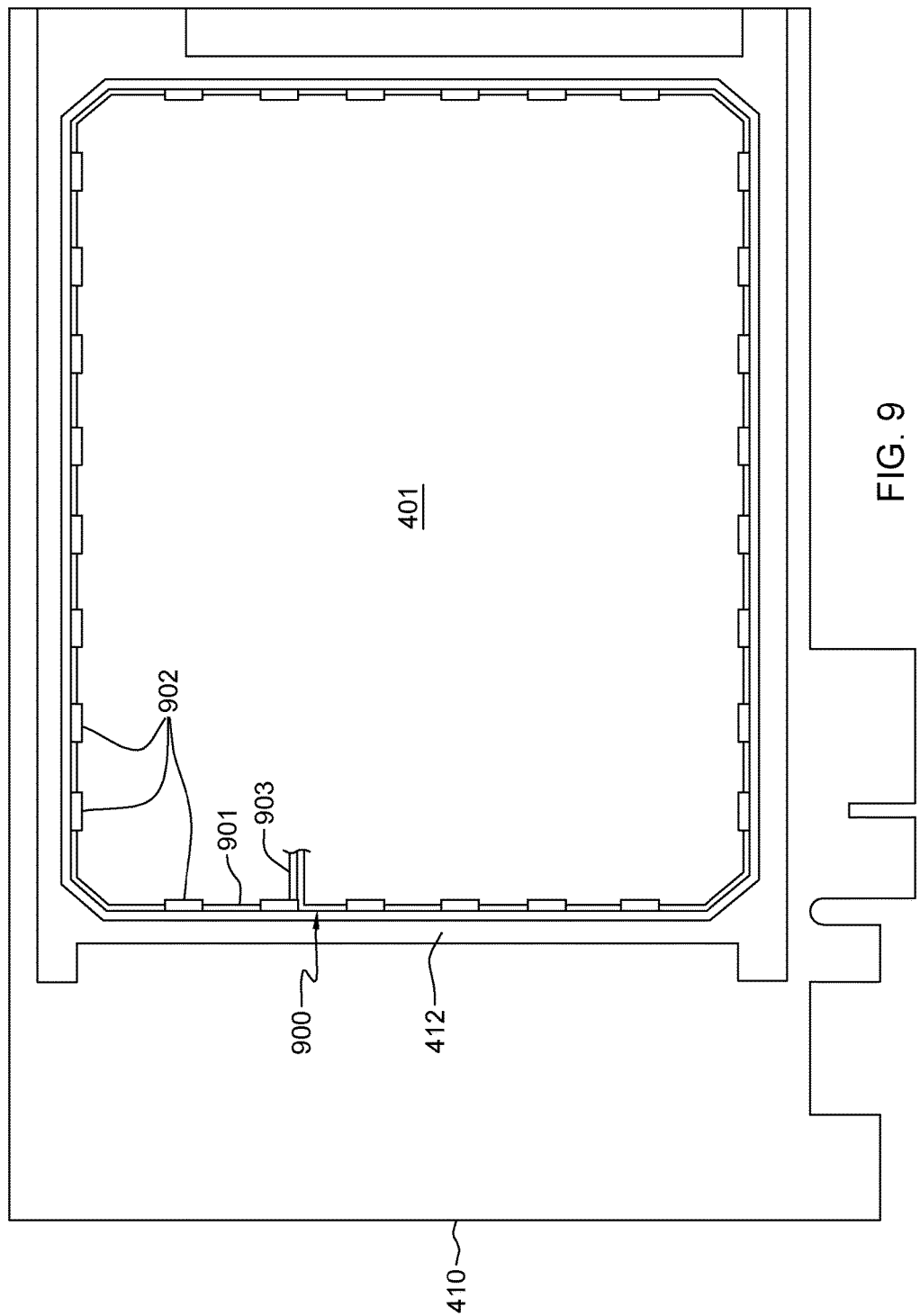

US 10,172,232 B2

TAMPER-RESPONDENT ASSEMBLIES WITH ENCLOSURE-TO-BOARD PROTECTION

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

SUMMARY

Provided herein, in one or more aspects, is a tamper-respondent assembly which includes: a circuit board; an electronic enclosure mounted to the circuit board and facilitating enclosing at least one electronic component within a secure volume; a tamper-respondent electronic circuit structure facilitating defining the secure volume, the tamper-respondent electronic circuit structure comprising a tamper-respondent circuit with at least one circuit line extending around an inner periphery of an enclosure-to-board interface where the electronic enclosure mounts to the circuit board; and an adhesive securing, in part, the electronic enclosure to the circuit board, the adhesive contacting, at least in part, the tamper-respondent circuit of the tamper-respondent circuit structure, wherein separation of the electronic enclosure from the circuit board causes the adhesive to break the tamper-respondent circuit, thereby facilitating detection of the separation.

In one or more other aspects, a tamper-respondent assembly is provided, which includes: a circuit board; at least one electronic component associated with the circuit board; an electronic enclosure mounted to the circuit board and facilitating enclosing the at least one electronic component within a secure volume; a tamper-respondent electronic circuit structure facilitating defining the secure volume, the tamper-respondent electronic circuit structure comprising a tamper-respondent circuit with at least one circuit line extending around an inner periphery of an enclosure-to-board interface where the electronic enclosure mounts to the circuit board; and an adhesive disposed between the electronic enclosure and the circuit board at an inner periphery of the electronic enclosure, the adhesive contacting, at least in part, the tamper-respondent circuit of the tamper-respondent electronic circuit structure, wherein separation of the electronic enclosure from the circuit board causes the adhesive to break the tamper-respondent circuit, thereby facilitating detection of the separation.

In one or more further aspects, a fabrication method is provided which includes fabricating a tamper-respondent assembly. The fabricating includes: providing a circuit board; providing an electronic enclosure to mount to the circuit board and enclose at least one electronic component within a secure volume; providing a tamper-respondent electronic circuit structure facilitating defining the secure volume, the tamper-respondent electronic circuit structure comprising a tamper-respondent circuit with at least one circuit line extending around an inner periphery of an enclosure-to-board interface where the electronic enclosure mounts to the circuit board; and providing an adhesive securing, in part, the electronic enclosure to the circuit board, the adhesive contacting, at least in part, the tamper-respondent circuit of the tamper-respondent electronic circuit structure, wherein separation of the electronic enclosure from the circuit board causes the adhesive to break the tamper-respondent circuit, thereby facilitating detection of the separation.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 9 is a plan view of one embodiment of the multilayer circuit board of FIGS. 4A & 4B, shown with a tamper-respondent circuit of a tamper-respondent electronic circuit structure, in accordance with one or more aspects of the present invention;

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for instance, for establishing a secure volume about an electronic component or electronic assembly to be protected.

Figure 1:
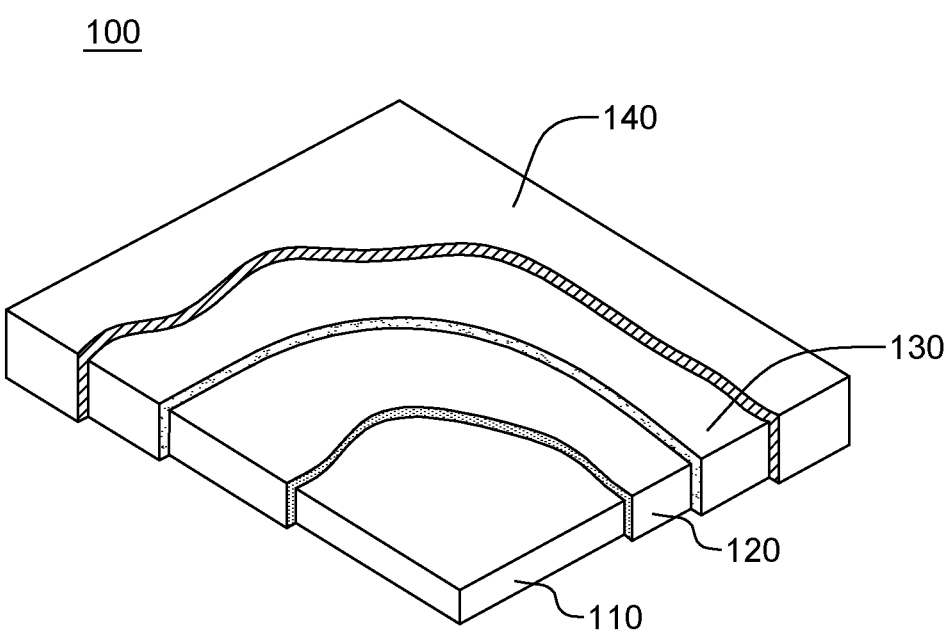
FIG. 1 is a partial cut-away of one embodiment of a tamper-proof electronic package which may incorporate a tamper-respondent electronic circuit structure, in accordance with one or more aspects of the present invention.

Reference is first made to FIG. 1 of the drawings, which illustrates one embodiment of an electronic assembly package 100 configured as a tamper-proof electronic assembly package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may comprise security-sensitive information with, for instance, access to the information stored in the module requiring use of a variable key, and with the nature of the key being stored in the associated memory within the enclosure.

In one or more implementations, a tamper-proof electronic package such as depicted is configured or arranged to detect attempts to tamper-with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multilayer circuit board, such as a printed circuit board or other multilayer substrate, and be internally or externally powered via a power supply provided within the electronic assembly enclosure.

In the embodiment illustrated, and as one example only, electronic assembly enclosure 110 may be surrounded by a tamper-respondent sensor 120, an encapsulant 130, and an outer, thermally conductive enclosure 140. In one or more implementations, tamper-respondent sensor 120 may include a tamper-respondent laminate that is folded around electronic assembly enclosure 110, and encapsulant 130 may be provided in the form of a molding. Tamper-respondent sensor 120 may include various detection layers, which are monitored through, for instance, a ribbon cable by the enclosure monitor, against sudden violent attempts to penetrate enclosure 110 and damage the enclosure monitor or erase circuit, before information can be erased from the encryption module. The tamper-respondent sensor may be, for example, any such article commercially available or described in various publications and issued patents, or any enhanced article such as disclosed herein.

By way of example, tamper-respondent sensor 120 may be formed as a tamper-respondent laminate comprising a number of separate layers with, for instance, an outermost lamination-respondent layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing carbon-loaded Polymer Thick Film (PTF) ink onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive ink printed onto an extension of the film, if desired. Connections between the matrix and the ribbon cable may be made via connectors formed on one edge of the film. As noted, the laminate may be wrapped around the electronic assembly enclosure to define the tamper-respondent sensor 120 surrounding enclosure 110.

In one or more implementations, the various elements of the laminate may be adhered together and wrapped around enclosure 110, in a similar manner to gift-wrapping a parcel, to define the tamper-respondent sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-respondent sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

Note that, as an enhancement, within a sealed electronic package, such as the tamper-proof electronic package depicted in FIG. 1 and described above, structures and methods for facilitating heat transfer from one or more electronic components disposed therein outwards through the enclosure and any other layers of the electronic package may be provided.

Figure 2:
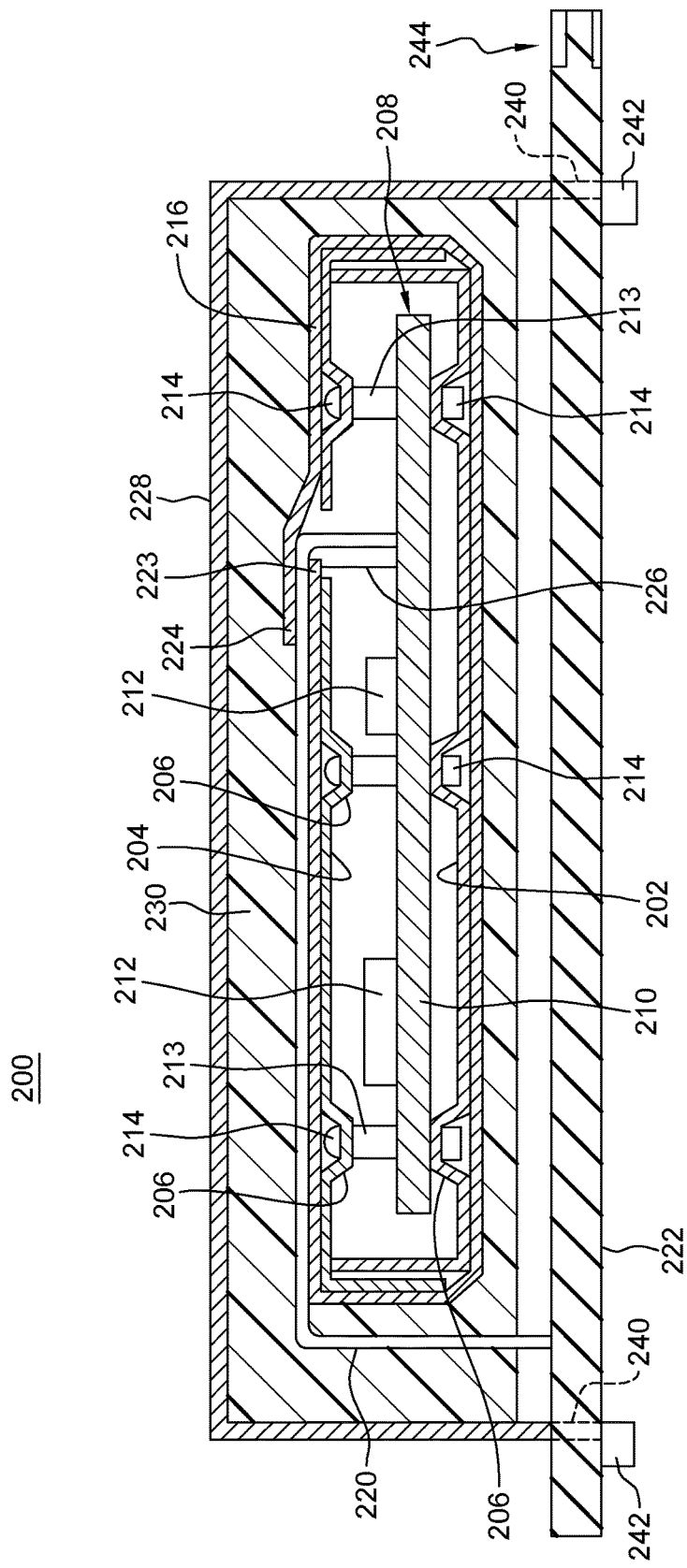
FIG. 2 is a cross-sectional elevational view of one embodiment of a prior art, tamper-proof electronic package comprising an electronic circuit.

FIG. 2 depicts in detail one embodiment of a typical tamper-proof electronic package 200. Electronic package 200 is defined by, for instance, a base metal shell 202 and a top metal shell 204. Outer surfaces of base metal shell 202 and top metal shell 204 may be provided with standoffs 206, with an electronic assembly 208 resting on standoffs 206 defined in base metal shell 202. Electronic assembly 208 may include, for instance, a printed circuit board 210 with electronic components 212 that are electrically connected via conductors (not shown) defined within or on printed circuit board 210.

Hollow spacers 213 may be placed below dimples 206 in top metal shell 204, and rivets 214 provided, extending through openings in dimples 206, through hollow spacers 213 and through openings in printed circuit board 210 to base metal shell 202 in order to fixedly secure electronic assembly 208 within the enclosure formed by base and top metal shells 202, 204. A security mesh or tamper-respondent sensor 216 is wrapped around the top, base, and four sides of the enclosure formed by base and top metal shells 202, 204. As illustrated, in one or more embodiments, top metal shell 204 may have an opening through which a bus 220 extends. One end of bus 220 may be connected to conductors (not shown) on printed circuit board 210, and the other end may be connected to conductors (not shown) on a printed circuit board 222. As bus 220 passes through the opening, the bus extends between an inner edge region 223 of the security mesh 216 and an overlapping, outer edge region 224 of the security mesh 216. A group of wires 226 connect, in one embodiment, security mesh 216 to conductors on printed circuit board 210. Circuitry on printed circuit board 210 is responsive to a break or discontinuity in security sensor array 216, in which case, an alarm signal may be emitted on bus 220, and also encryption/decryption keys stored within electronic assembly 208 may be erased.

In one or more implementations, liquid polyurethane resin may be applied to security mesh 216 and cured. An outer, thermally conductive enclosure 228, such as a copper enclosure, may be filled with liquid polyurethane resin with the electronic assembly and inner enclosure and security mesh suspended within it. Upon curing the resin, the electronic assembly and inner enclosure and security mesh become embedded in a polyurethane block or encapsulant 230, as shown. The enclosure 228 is mounted on the printed circuit board 222, which can be accomplished using, for instance, legs 240 which extend through slots in printed circuit board 222 and terminate in flanges 242, which are then bent out of alignment with the slots. Bus 220 may be connected, by way of printed circuit board 222 to connectors 244 located along, for instance, one edge of printed circuit board 222.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs). Security Level 4 cryptographic modules are useful for operation in physically unprotected environments. Security Level 4 also protects a cryptographic module against a security compromise due to environmental conditions or fluctuations outside of the module's normal operating ranges for voltages and temperature. Intentional excursions beyond the normal operating ranges may be used by an attacker to thwart the cryptographic module's defenses. The cryptographic module is required to either include specialized environmental protection features designed to detect fluctuations and zeroize critical security parameters, or to undergo rigorous environmental failure testing to provide reasonable assurance that the module will not be affected by fluctuations outside of the normal operating range in a manner that can compromise the security of the module.

To address the demands of ever-improving anti-intrusion technology, and the higher-performance encryption/decryption functions being provided, enhancements to the tamper-proof, tamper-evident packaging for the electronic assembly at issue are desired. Numerous enhancements are described hereinbelow to, for instance, tamper-respondent assemblies and tamper-respondent sensors. Note that the numerous inventive aspects described herein may be used singly, or in any desired combination. Additionally, in one or more implementations, the enhancements to tamper-proof electronic packaging described herein may be provided to work within defined space limitations for existing packages. For instance, one or more of the concepts described may be configured to work with peripheral component interconnect express (PCIe) size limits, and the limitations resulting from being capsulated in, for instance, an insulating encapsulant.

Thus, disclosed hereinbelow with reference to FIGS. 3-14C are various approaches and/or enhancements to creating, for instance, a secure volume for accommodating one or more electronic components, such as one or more encryption and/or decryption modules and associated components of a communications card or other electronic assembly.

Figure 3:
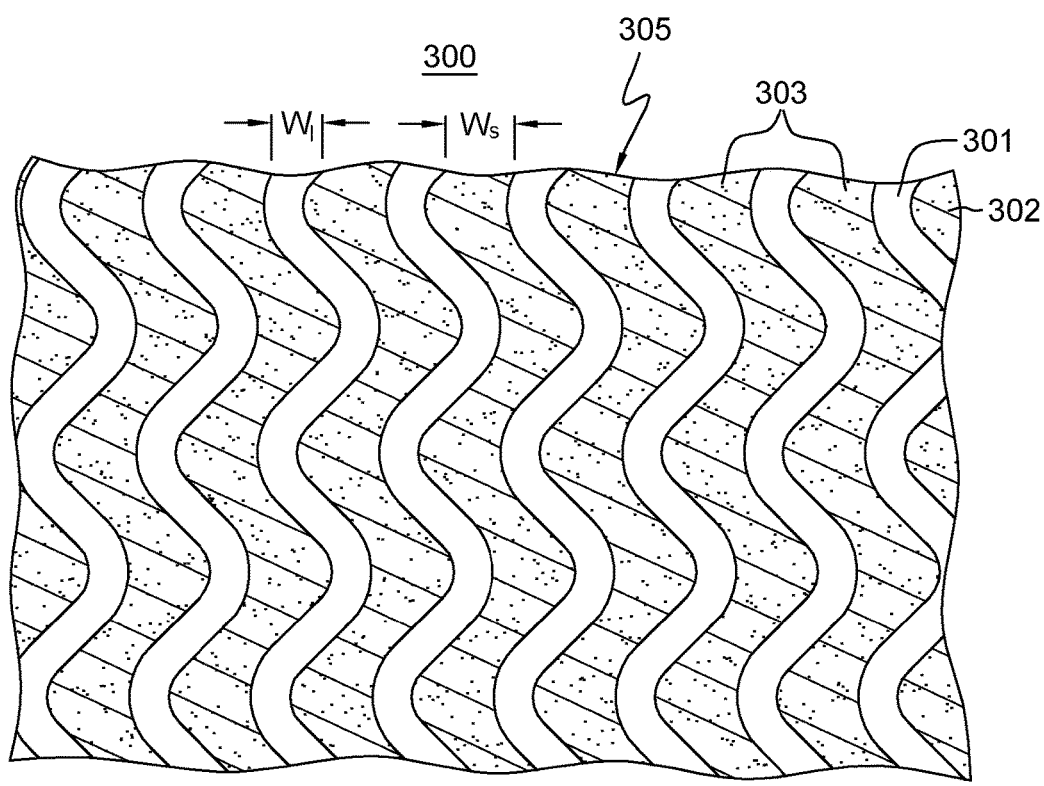
FIG. 3 depicts one embodiment of a tamper-respondent sensor comprising one or more flexible layers and circuit lines forming at least one tamper-detect network, in accordance with one or more aspects of the present invention.

FIG. 3 depicts a portion of one embodiment of a tamper-respondent layer 305 (or laser and pierce-respondent layer)

of a tamper-respondent sensor 300 or security sensor, such as discussed herein. In FIG. 3, the tamper-respondent layer 305 includes circuit lines or traces 301 provided on one or both opposite sides of a flexible layer 302, which in one or more embodiments, may be a flexible insulating layer or film. FIG. 3 illustrates circuit lines 301 on, for instance, one side of flexible layer 302, with the traces on the opposite side of the film being, for instance, the same pattern, but (in one or more embodiments) offset to lie directly below spaces 303, between circuit lines 301. As described below, the circuit lines on one side of the flexible layer may be of a line width W and have a pitch or line-to-line spacing $W_s$ such that piercing of the layer 305 at any point results in damage to at least one of the circuit lines traces 301. In one or more implementations, the circuit lines may be electrically connected in-series or parallel to define one or more conductors which may be electrically connected in a network to an enclosure monitor, which monitors the resistance of the lines, as described herein. Detection of an increase, or other change, in resistance, caused by cutting or damaging one of the traces, will cause information within the encryption and/or decryption module to be erased. Providing conductive lines 301 in a pattern, such as a sinusoidal pattern, may advantageously make it more difficult to breach tamper-respondent layer 305 without detection. Note, in this regard, that conductive lines 301 could be provided in any desired pattern. For instance, in an alternate implementation, conductive lines 301 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, the above-summarized tamper-respondent sensor 300 of FIG. 3 may be disposed over an outer surface of an electronic enclosure, such as an electronic enclosure described above in connection with FIGS. 1 & 2. Alternatively, as described further herein, the tamper-respondent sensor may cover or line an inner surface of an electronic enclosure to provide a secure volume about at least one electronic component to be protected. Numerous enhancements to the tamper-respondent sensor itself are described below.

In one or more aspects, disclosed herein is a tamper-respondent sensor 300 with circuit lines 301 having reduced line widths $W_1$ of, for instance, 200 μm, or less, such as less than or equal to 100 μm, or even more particularly, in the range of 30-70 μm. This is contrasted with conventional trace widths, which are typically on the order of 350 μm or larger. Commensurate with reducing the circuit line width $W_1$, line-to-line spacing width $W_s$ 303 is also reduced to less than or equal to 200 μm, such as less than or equal to 100 μm, or for instance, in a range of 30-70 μm. Advantageously, by reducing the line width $W_1$ and line-to-line spacing $W_s$ of circuit lines 301 within tamper-respondent sensor 300, the circuit line width and pitch is on the same order of magnitude as the smallest intrusion instruments currently available, and therefore, any intrusion attempt will necessarily remove a sufficient amount of a circuit line(s) to cause resistance to change, and thereby the tamper intrusion to be detected. Note that, by making the circuit line width of the smaller dimensions disclosed herein, any cutting or damage to the smaller-dimensioned circuit line will also be more likely to be detected, that is, due to a greater change in resistance. For instance, if an intrusion attempt cuts a 100 μm width line, it is more likely to reduce the line width sufficiently to detect the intrusion by a change in resistance.

A change in a narrower line width is more likely to result in a detectable change in resistance, compared with, for instance, a 50% reduction in a more conventional line width of 350 μm to, for instance, 175 μm. The smaller the conductive circuit line width becomes, the more likely that a tampering of that line will be detected.

Note also that a variety of materials may advantageously be employed to form the circuit lines. For instance, the circuit lines may be formed of a conductive ink (such as a carbon-loaded conductive ink) printed onto one or both opposite sides of one or more of the flexible layers 302 in a stack of such layers. Alternatively, a metal or metal alloy could be used to form the circuit lines, such as copper, silver, intrinsically conductive polymers, carbon ink, or nickel-phosphorus (NiP), or Omega-Ply®, offered by Omega Technologies, Inc. of Culver City, Calif. (USA), or Ticer™ offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, may be employed. By way of further example, if conductive ink is employed as the circuit line material, fine circuit lines on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 μm), and a squeegee angle may be used such that the ink is sheared to achieve conductive ink breakaway rather than pumping the conductive ink through the screen apertures. Note that the screen for fine line width printing such as described herein may have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In one or more implementations, circuit lines 301 of tamper-respondent sensor 300 are electrically connected to define one or more resistive networks. Further, the circuit lines may include one or more resistive circuit lines by selecting the line material, line width $W_1$ and line length $L_1$, to provide a desired resistance per line. As one example, a "resistive circuit line" as used herein may comprise a line with 1000 ohms resistance or greater, end-to-end. In one specific example, a circuit line width of 50 μm, with a circuit line thickness of 10 μm may be used, with the line length $L_1$ and material selected to achieve the desired resistance. At the dimensions described, good electrical conductors such as copper or silver may also be employed and still form a resistive network due to the fine dimensions noted. Alternatively, materials such as conductive ink or the above-noted Omega-Ply® or Ticer™ may be used to define resistive circuit lines.

In a further aspect, the flexible layer 302 itself may be further reduced in thickness from a typical polyester layer by selecting a crystalline polymer to form the flexible layer or substrate. By way of example, the crystalline polymer could comprise polyvinylidene difluoride (PVDF), or Kapton, or other crystalline polymer material. Advantageously, use of a crystalline polymer as the substrate film may reduce thickness of the flexible layer 302 to, for instance, 2 mils thick from a more conventional amorphous polyester layer of, for instance, 5-6 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-respondent layer stack, the stack thickness can be reduced from, for instance, 20 mils in the case of a typical polyester film, to 10 mils or less with the use of crystalline polymer films.

Figure 4A:
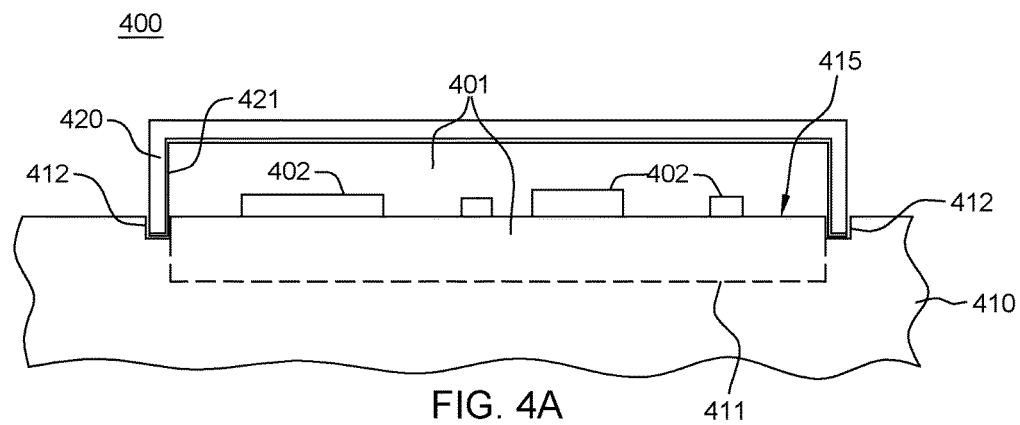
FIG. 4A is a cross-sectional elevational view of one embodiment of a tamper-respondent assembly, or tamper-proof electronic package, which includes (in part) a tamper-respondent sensor embedded within a multilayer circuit board, in accordance with one or more aspects of the present invention.
Figure 4B:
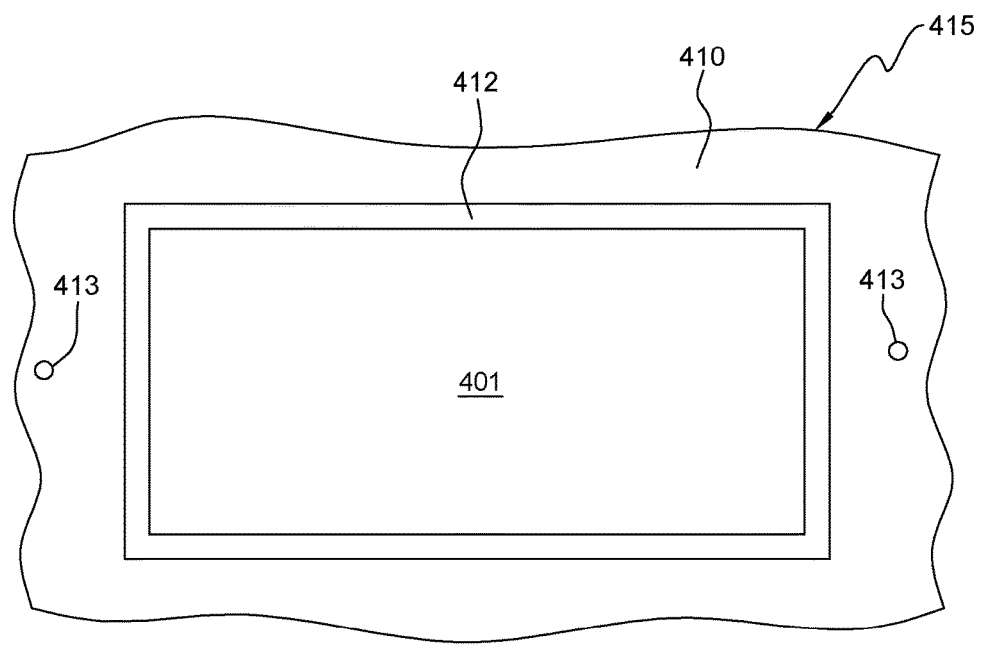
FIG. 4B is a top plan view of the multilayer circuit board of FIG. 4A, depicting one embodiment of the secure volume where defined, in part, within the multilayer circuit board, in accordance with one or more aspects of the present invention.

By way of further example, FIGS. 4A & 4B depict one embodiment of tamper-respondent assembly 400, or tamper-proof electronic package, which comprises an electronic circuit 415 to be protected, in accordance with one or more further aspects of the present invention.

Referring collectively to FIGS. 4A & 4B, electronic circuit 415 includes a multilayer circuit board 410 which has an embedded tamper-respondent sensor 411 therein that facilitates defining, in part, a secure volume 401 associated with multilayer circuit board 410 that extends into multilayer circuit board 410. In particular, in the embodiment of FIGS. 4A & 4B, secure volume 401 exists partially within multilayer circuit board 410, and partially above multilayer circuit board 410. One or more electronic components 402 are mounted to multilayer circuit board 410 within secure volume 401 and may comprise, for instance, one or more encryption modules and/or decryption modules, and associated components, with the tamper-proof electronic package comprising, in one or more embodiments, a communications card of a computer system.

Tamper-proof electronic package 400 further includes an enclosure 420, such as a pedestal-type enclosure, mounted to multilayer circuit board 810 within, for instance, a continuous groove (or trench) 412 formed within an upper surface of multilayer circuit board 410. In one or more embodiments, enclosure 420 may comprise a thermally conductive material and operate as a heatsink for facilitating cooling of the one or more electronic components 402 within the secure volume. A security mesh or tamper-respondent sensor 421, such as the above-described tamper-respondent sensors of FIG. 3, may be associated with enclosure 420, for example, wrapping around the inner surface of enclosure 420 to facilitate defining, in combination with tamper-respondent sensor 411 embedded within multilayer circuit board 410, secure volume 401. In one or more implementations, tamper-respondent sensor 421 extends down into continuous groove 412 in multilayer circuit board 410 and may, for instance, even wrap partially or fully around the lower edge of enclosure 420 within continuous groove 412 to provide enhanced tamper-detection where enclosure 420 couples to multilayer circuit board 410. In one or more implementations, enclosure 420 may be securely affixed to multilayer circuit board 410 using, for instance, a bonding material such as an epoxy or other adhesive.

As depicted in FIG. 4B, one or more external circuit connection vias 413 may be provided within multilayer circuit board 410 for electrically connecting to the one or more electronic components 402 (FIG. 4A) within secure volume 401. These one or more external circuit connection vias 413 may electrically connect to one or more external signal lines or planes (not shown) embedded within multilayer circuit board 410 and extending, for instance, into a secure base region of (or below) secure volume 401, as explained further below. Electrical connections to and from secure volume 401 may be provided by coupling to such external signal lines or planes within the multilayer circuit board 410.

As noted with reference to FIGS. 4A & 4B, secure volume 401 defined in association with multilayer circuit board 410 may be sized to house electronic components 402 to be protected, and be constructed to extend into multilayer circuit board 410. In one or more implementations, multilayer circuit board 410 includes electrical interconnect within the secure volume 401 defined in the board, for instance, for electrically connecting the multiple tamper-respondent layers of the embedded tamper-respondent sensor 411 to associated monitor circuitry also disposed within secure volume 401, along with, for instance, one or more daughter cards, such as memory DIMMs, PCIe cards, processor cards, etc.

Note that the embodiment depicted in FIGS. 4A & 4B is presented by way of example only. In one or more other implementations, the electronic circuit may comprise multiple multilayer circuit boards, each with a tamper-respondent sensor embedded within the multilayer circuit board with an appropriate connector, located within a secure volume defined between two adjacent multilayer circuit boards, interconnecting selected wiring of the multilayer circuit boards. In such an implementation, the overlying multilayer circuit board could be hollowed out to accommodate, for instance, the connector and/or one or more other electronic components between the multilayer circuit boards. In addition, other configurations of enclosure 420, and/or other approaches to coupling enclosure 420 and multilayer circuit board 410 may be employed.

Figure 5:
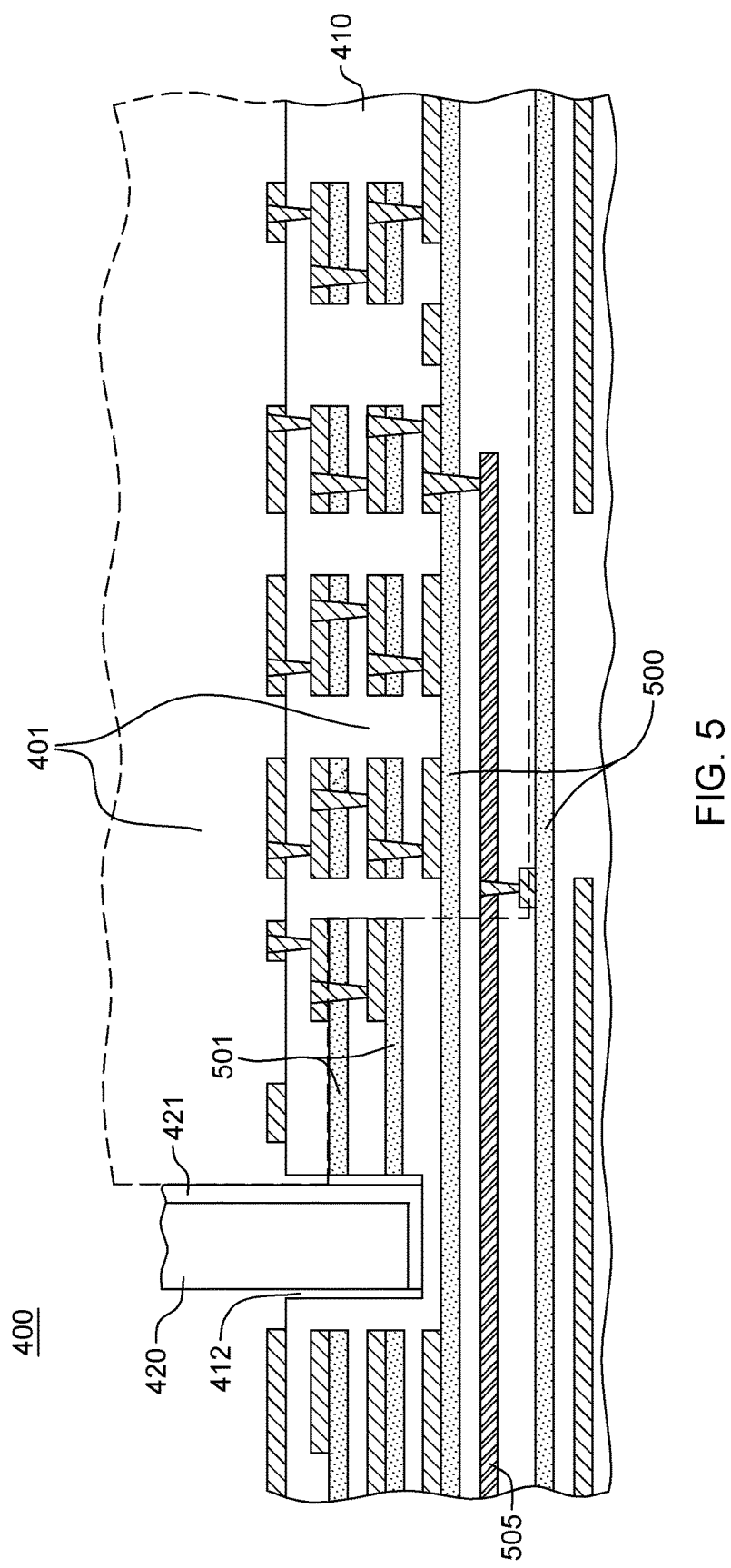
FIG. 5 is a partial cross-sectional elevational view of a tamper-respondent assembly comprising (in part) a multilayer circuit board and embedded tamper-respondent sensor, in accordance with one or more aspects of the present invention.

By way of further example, FIG. 5 depicts a partial cross-sectional elevational view of one embodiment of multilayer circuit board 410 and enclosure 420. In this configuration, the embedded tamper-respondent sensor includes multiple tamper-respondent layers including, by way of example, at least one tamper-respondent mat (or base) layer 500, and at least one tamper-respondent frame 501. In the example depicted, two tamper-respondent mat layers 500 and two tamper-respondent frame 501 are illustrated, by way of example only. The lower-most tamper-respondent mat layer 500 may be a continuous sense or detect layer extending completely below the secure volume being defined within multilayer circuit board 510. One or both tamper-respondent mat layers 500 below secure volume 401 may be partitioned into multiple circuit zones, as discussed further below. Within each tamper-respondent mat layer, or more particularly, within each circuit zone of each tamper-respondent mat layer, multiple circuits or conductive traces are provided in any desired configuration, such as the configuration described above in connection with FIG. 3. Further, the conductive traces within the tamper-respondent layers may be implemented as, for instance, a resistive layer which is difficult to attach shunt circuits to, as explained further below.

As illustrated, one or more external signal lines or planes 505 enter secure volume 401 between, in this embodiment, two tamper-respondent mat layers 500, and then electrically connect upwards into the secure volume 401 through one or more conductive vias, arranged in any desired location and pattern. In the configuration depicted, the one or more tamper-respondent frames 501 are disposed at least inside of the area defined by continuous groove 512 accommodating the base of enclosure 520. Together with security sensor 421 associated with enclosure 420, tamper-respondent frames 501 define secure volume 401 where extending, in part, into multilayer circuit board 410. With secure volume 401 defined, at least in part, within multilayer circuit board 410, the external signal line(s) 505 may be securely electrically connected to, for instance, the one or more electronic components 402 (FIG. 4A) mounted to multilayer circuit board 410 within secure volume 401. In addition, the secure volume 401 may accommodate electrical interconnection of the conductive traces of the multiple tamper-respondent layers, for instance, via appropriate monitor circuitry.

Added security may be provided by extending tamper-respondent mat layers 500 (and if desired, tamper-respondent frames 501) outward past continuous groove 412 accommodating enclosure 420. In this manner, a line of attack may be made more difficult at the interface between enclosure 420 and multilayer circuit board 410 since the attack would need to clear tamper-respondent mat layers 500, the bottom edge of tamper-respondent sensor 421 associated with enclosure 420, as well as the tamper-respondent frames 501 of the embedded tamper-respondent sensor.

Variations on the multilayer circuit board 410 of FIG. 4A are possible. For instance, in one embodiment, the embedded tamper-respondent sensor may include multiple tamper-respondent mat layers 500 and multiple tamper-respondent frames 501, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, would be facilitated.

Note also that, once within the secure volume is defined within multilayer circuit board 410, conductive vias within the secure volume between layers of multilayer circuit board 410 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-respondent layers of the multiple tamper-respondent layers more difficult.

The tamper-respondent layers of the embedded tamper-respondent sensor formed within the multilayer circuit board of the electronic circuit or electronic package may include multiple conductive traces or lines formed between, for instance, respective sets of input and output contacts or vias at the trace termination points. Any number of conductive traces or circuits may be employed in defining a tamper-respondent layer or a tamper-respondent circuit zone within a tamper-respondent layer. For instance, 4, 6, 8, etc., conductive traces may be formed in parallel (or otherwise) within a given tamper-respondent layer or circuit zone between the respective sets of input and output contacts to those conductive traces.

Figure 6:
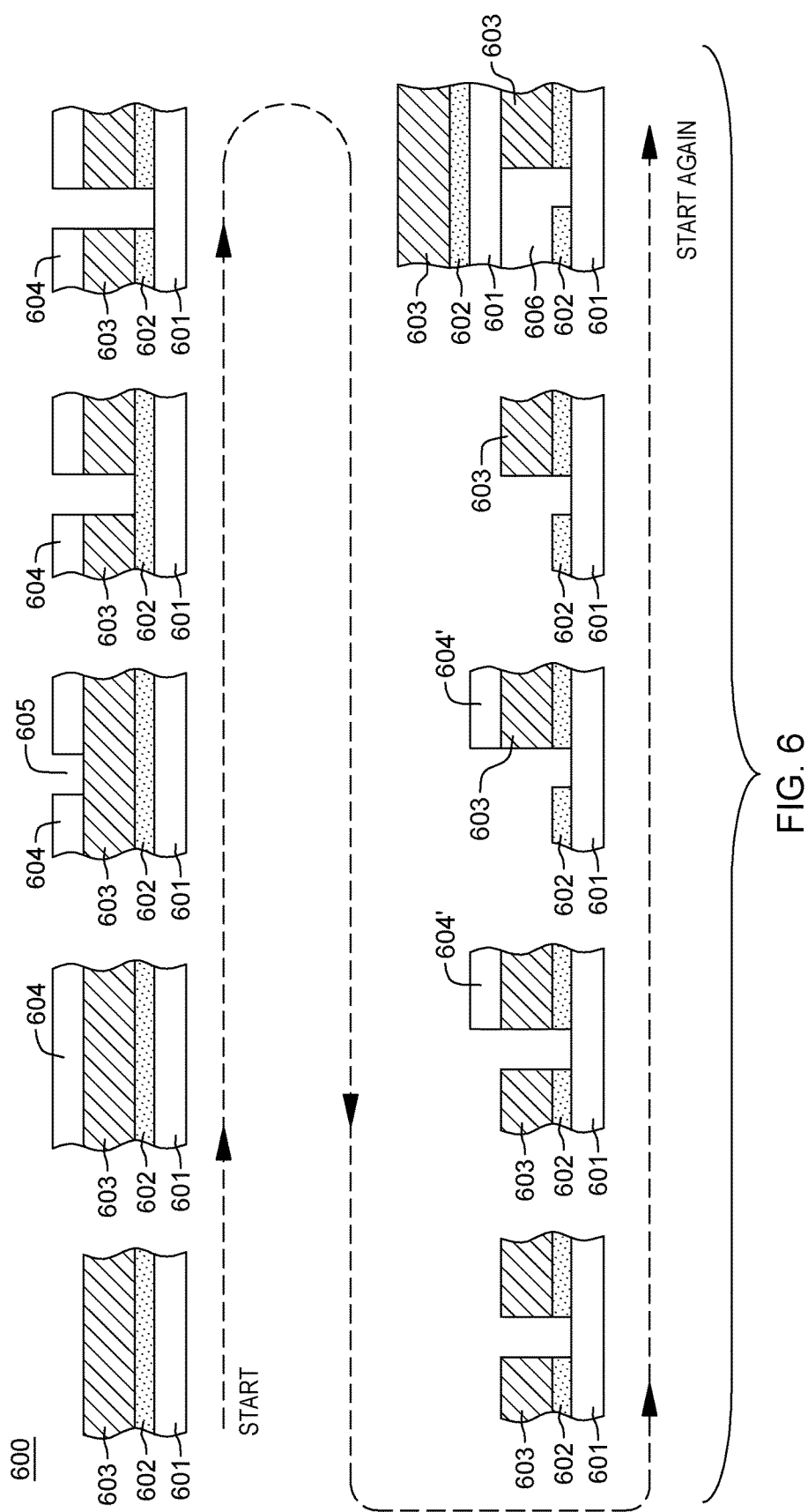
FIG. 6 depicts one embodiment of a process of fabricating a multilayer circuit board with an embedded tamper-respondent sensor, in accordance with one or more aspects of the present invention.

In one or more implementations, the multilayer circuit board may be a multilayer wiring board or printed circuit board formed, for instance, by building up the multiple layers of the board. FIG. 6 illustrates one embodiment for forming and patterning a tamper-respondent layer within such a multilayer circuit board.

As illustrated in FIG. 6, in one or more implementations, a tamper-respondent layer, such as a tamper-respondent mat layer or a tamper-respondent frame disclosed herein, may be formed by providing a material stack comprising, at least in part, a structural layer 601, such as a pre-preg (or pre-impregnated) material layer, a trace material layer 602 for use in defining the desired trace patterns, and an overlying conductive material layer 603, to be patterned to define conductive contacts or vias electrically connecting to the pattern of traces being formed within the trace material layer 602, for instance, at trace terminal points. In one or more implementations, the trace material layer 602 may comprise nickel phosphorous (NiP), and the overlying conductive layer 603 may comprise copper. Note that these materials are identified by way of example only, and that other trace and/or conductive materials may be used within the build-up 600.

A first photoresist 604 is provided over build-up 600, and patterned with one or more openings 605, through which the overlying conductive layer 603 may be etched. Depending on the materials employed, and the etch processes used, a second etch process may be desired to remove portions of trace material layer 602 to define the conductive traces of the subject tamper-respondent layer. First photoresist 1004 may then be removed, and a second photoresist 604' is provided over the conductive layer 603 features to remain, such as the input and output contacts. Exposed portions of conductive layer 603 are then etched, and the second photoresist 604' may be removed, with any opening in the layer being filled, for instance, with an adhesive (or pre-preg) and a next build-up layer is provided, as shown. Note that in this implementation, most of overlying conductive layer 603 is etched away, with only the conductive contacts or vias remaining where desired, for instance, at the terminal points of the traces formed within the layer by the patterning of the trace material layer 602. Note that any of a variety of materials may be employed to form the conductive lines or traces within a tamper-respondent layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

The trace lines or circuits within all of the tamper-respondent layers, and in particular, the tamper-respondent circuit zones, of the embedded tamper-respondent sensor, along with the tamper-respondent sensor 421 (FIG. 4A), may be electrically connected into monitor or compare circuitry provided, for instance, within secure volume 401 (FIG. 4A) of multilayer circuit board 410. The monitor circuitry may include various bridge or compare circuits, and conventional printed wiring board electrical interconnect inside the secure volume 401, for instance, located within the secure volume defined by the tamper-respondent frames 501 (FIG. 5), and the tamper-respondent mat layers.

Note that advantageously, different tamper-respondent circuit zones on different tamper-respondent layers may be electrically interconnected into, for instance, the same comparator circuit, Wheatstone bridge, or similar monitor circuitry. Thus, any of a large number of interconnect configurations may be possible. For instance, if each of two tamper-respondent mat layers contains 30 tamper-respondent circuit zones, and each of two tamper-respondent frames contains 4 tamper-respondent circuit zones, then, for instance, the resultant 68 tamper-respondent circuit zones may be connected in any configuration within the secure volume to create the desired arrangement of circuit networks within the secure volume being monitored for changes in resistance or tampering. Note in this regard, that the power supply or battery for the tamper-respondent sensor may be located external to the secure volume, with the sensor being configured to trip and destroy any protected or critical data if the power supply or battery is tampered with.

Figure 7:
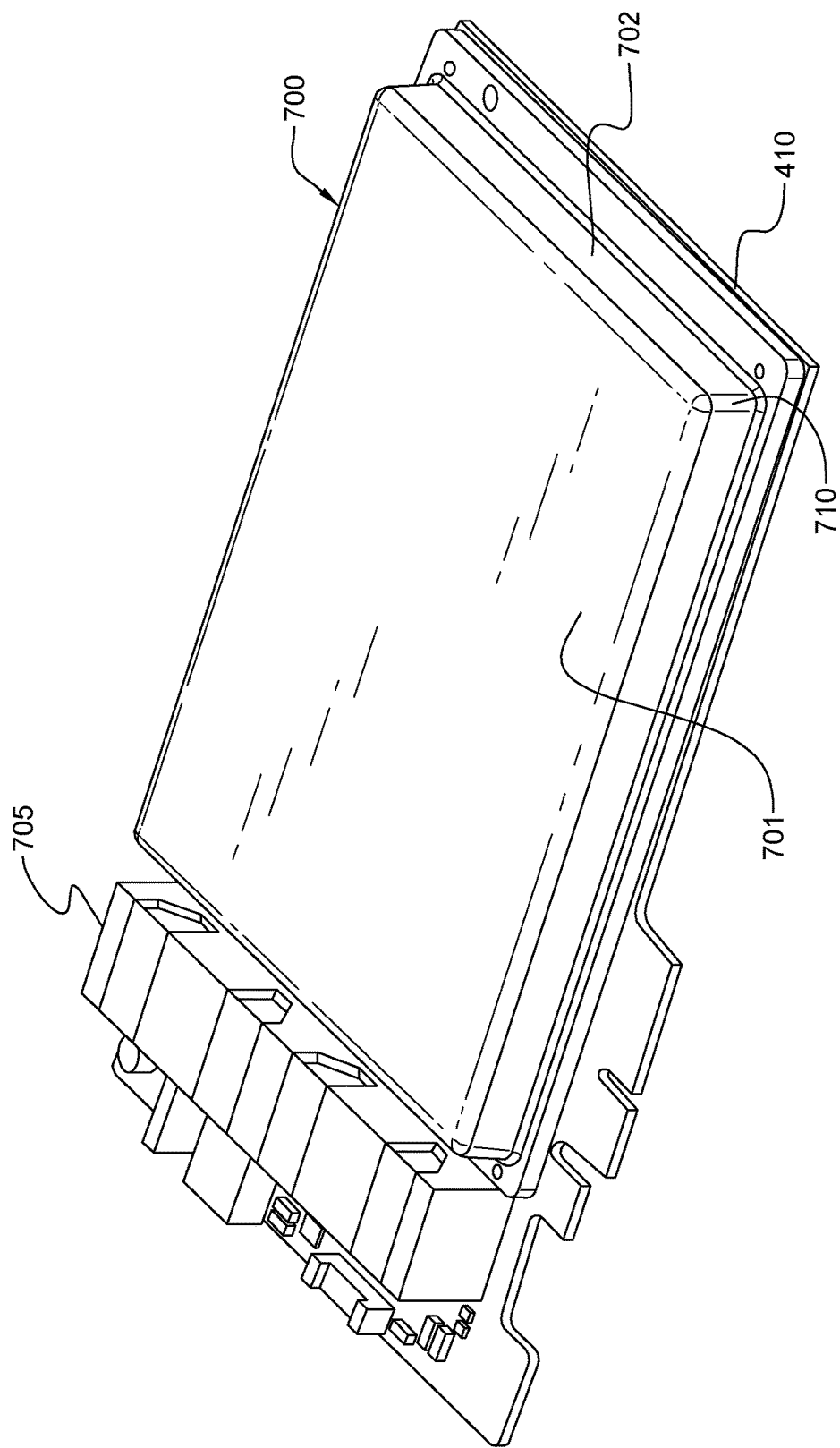
FIG. 7 is isometric view of one embodiment of a tamper-respondent assembly, or tamper-proof electronic package, which includes (in part) a multilayer circuit board with embedded tamper-respondent sensor, in accordance with one or more aspects of the present invention.

By way of example, an isometric view of one embodiment of a tamper-respondent assembly, or tamper-proof electronic package, is depicted in FIG. 7, wherein an electronic enclosure 700 is shown sealed to multilayer circuit board 410 to define a secure volume about one or more electronic components, as described herein. In the embodiment depicted, electronic enclosure 700 includes a main surface 701 and sidewall(s) 702 which include sidewall corners 710. An inner surface of electronic enclosure 700 would include an inner main surface, and an inner-sidewall surface corresponding to main surface 701 and sidewall(s) 702, respectively, with the inner main surface and inner-sidewall surfaces being covered, at least in part, by a tamper-respondent sensor such as described herein. A power supply 705 or battery for the tamper-respondent sensor is located, in this embodiment, external to the secure volume, with the sensor again being configured to trip and destroy any protected or critical data if the power supply or battery is tampered with. Electronic enclosure 700 may be adhered or mechanically affixed to multilayer circuit board 410, which as noted above, may include its own embedded tamper-respondent sensor layer(s).

In one or more implementations, the tamper-respondent assembly may incorporate or include an air path to adjust air pressure within the secure volume of the assembly to equalize with air pressure external to the assembly. By way of example, an air vent may be provided through electronic enclosure 700, and this air vent may be in fluid communication with a vent structure disposed between the electronic enclosure and the multilayer circuit board. For instance, the vent structure may comprise a low profile vent structure sandwiched between overlapping regions of a tamper-respondent sensor covering an inner-sidewall surface of the electronic enclosure. The vent structure includes at least one air passage coupling in fluid communication the secure volume defined by the assembly and the air vent in electronic enclosure 700. Note that in this context "in fluid communication" refers to air or gas communication being established between the secure volume provided by the tamper-respondent assembly, and the air vent through the electronic enclosure.

Figure 8A:
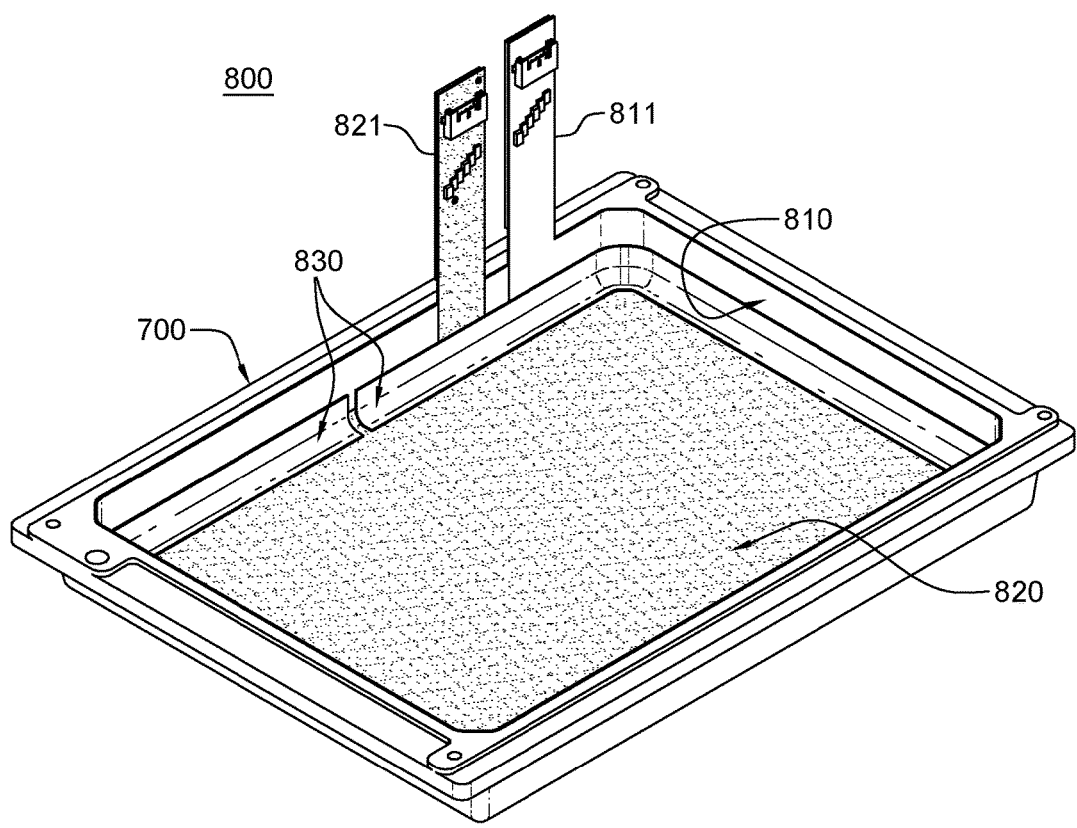
FIG. 8A depicts an underside, perspective view of one embodiment of a tamper-respondent assembly comprising an electronic enclosure and multiple tamper-respondent sensors, in accordance with one or more aspects of the present invention.
Figure 8B:
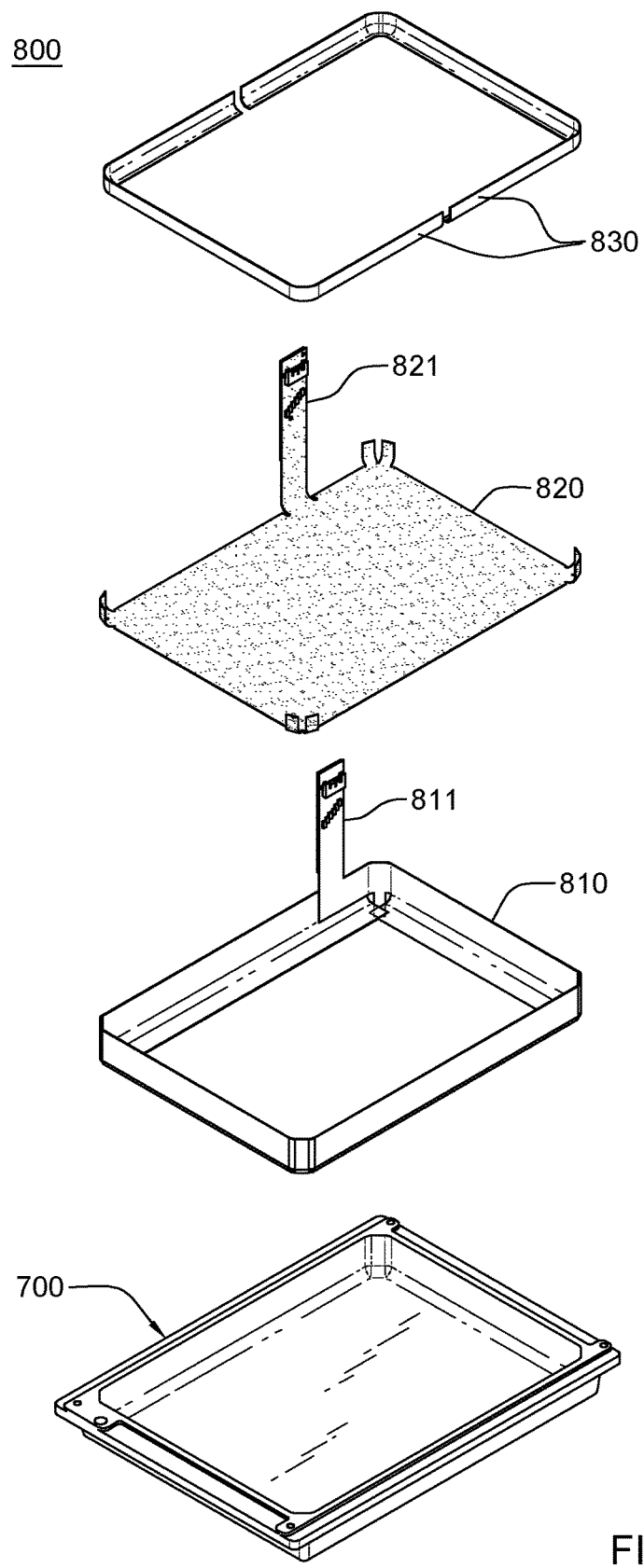
FIG. 8B depicts an exploded view of the tamper-respondent assembly of FIG. 8A, in accordance with one or more aspects of the present invention.

FIGS. 8A & 8B depict underside, isometric views of one embodiment of a tamper-respondent assembly employing electronic enclosure 700. Referring collectively to FIGS. 8A & 8B, in one or more implementations, tamper-respondent assembly 800 includes electronic enclosure 700 which, as noted, is to enclose, at least in part, one or more electronic components or an electronic assembly to be protected, and associated with, for instance, a multilayer circuit board. Electronic enclosure 700 includes an inner main surface, and an inner-sidewall surface including at least one inner-sidewall corner, such as described above in connection with FIG. 7. Further, tamper-respondent assembly 800 includes a tamper-respondent electronic circuit structure which includes at least one tamper-respondent sensor mounted to and covering, at least in part, the inner surface(s) of electronic enclosure 700. As explained further below, the tamper-respondent sensor(s) is configured so as to facilitate good contact, and good adhesion, of the sensor to the inner surfaces of the enclosure, such as, for instance, the one or more inner-sidewall corners of the electronic enclosure 700, to provide secure coverage of the tamper-respondent sensor(s) over the inner surface(s) of the electronic enclosure.

As illustrated, in one or more implementations, the tamper-respondent electronic circuit structure associated with electronic enclosure 700 may include an inner-sidewall tamper-respondent sensor 810 and an inner main surface tamper-respondent sensor 820, along with a security band or element 830. In the illustrated example, inner-sidewall tamper-respondent sensor 810 may be formed with an integrated flex ribbon cable or extension 811 to facilitate electrical connection of the at least one resistive network within inner-sidewall tamper-respondent sensor 810 to appropriate monitor circuitry (not shown) disposed within, for instance, the secure volume defined, at least in part, by the tamper-respondent assembly of FIGS. 8A & 8B. Similarly, inner main surface tamper-respondent sensor 820 may be configured with an integrated flex ribbon cable or extension 821 to facilitate electrical connection of inner main surface tamper-respondent sensor 820 to the monitor circuitry, as well. A bonding agent (discussed below), such as a thermoset adhesive, may be employed to adhere inner-sidewall tamper-respondent sensor 820 to the inner-sidewall surface and to inner-sidewall corners. A similar adhesive could be used to adhere inner main surface tamper-respondent sensor 820 to inner main surface and to inner-sidewall tamper-respondent sensor 810 where the sensors overlap. Security band 830 may further be adhesively secured over the overlap between inner main surface tamper-respondent sensor 820 and inner-sidewall tamper-respondent sensor 810 covering, in one or more implementations, transition regions between the inner-sidewall surface and the inner main surface around the inner perimeter of electronics enclosure 700.

Note that, in the example provided in FIGS. 8A & 8B, inner-sidewall tamper-respondent sensor 810 and inner main surface tamper-respondent sensor 820 are discrete tamper-respondent sensors that overlap, at least in part, and facilitate defining a secure volume about the at least one electronic component to be protected. For instance, the secure volume may be defined by flipping over and securing the illustrated tamper-respondent assembly of FIGS. 8A & 8B to a multilayer circuit board with an embedded tamper-respondent sensor, such as described above.

By way of further enhancement, increased protection against and/or sensitivity to a tamper event may be desired at or adjacent to, the enclosure-to-board interface. For instance, one issue addressed herein is to provide enhanced resistance against a chemical attack at the interface between the electronic enclosure and circuit board, in an attempt to separate the enclosure and board, while circumventing the tamper-respondent circuitry of the assembly. Any attempt to remove the electronic enclosure from the board needs to be detected by the circuitry monitoring the tamper-respondent assembly. In particular, enhancements are provided herein to protect against either a mechanical or chemical attack at the enclosure-to-board interface, and/or to facilitate detection of such an attack by the tamper-respondent electronic circuit structure providing, or defining, the secure volume of the tamper-respondent assembly.

By way of example, enhanced protection against chemical attack may be obtained by using in series different types of encapsulants and/or adhesives at the interface of the electronic enclosure and circuit board. For example, a structural adhesive may be employed within the continuous groove or trench receiving the electronic enclosure edge, and an encapsulant, such as an electrically conductive encapsulant, could be provided about the periphery of the enclosure-to-board interface. Advantageously, such a differently-based-material facilitates both electromagnetic protection, and as an alternative material (e.g., silicone) helps with preventing chemical attack, such as a chemical attack using Methylene Chloride, which is one of the chemicals required to protect against during FIPS 140-2 security testing for level 4 security assembly. The combination of two or more different materials-based adhesives and/or encapsulants in series at the interface between the electronic enclosure and circuit board (for instance, in an inward direction towards the secure volume of the tamper-respondent assembly), advantageously provides an enhanced range of resistance against chemical attack at the interface.

Additionally, a tamper-respondent circuit of the tamper-respondent electronic circuit structure may be provided about an inner periphery of the enclosure-to-board interface. Along with the tamper-respondent circuit at the inner periphery, an adhesive, such as a strong, structural adhesive, may be provided internally of the electronic enclosure at, for instance, the inner periphery thereof in a location where chemical attack is very difficult to perform, such as within the region of the board encircled by the continuous groove. When an attack attempts to lift the electronic enclosure from the circuit board, the adhesive in contact with the tamper-respondent circuit causes a break in the tamper-respondent circuit, which facilitates detection of the separation by the monitor circuitry.

By way of example, the tamper-respondent circuit may include a plurality of surface-mount technology (SMT) components or structures, such as resistors. For instance, a plurality of surface-mount, zero-ohm resistors, or other low-resistance components, may be mounted to the circuit board at an inner periphery of the enclosure-to-board interface, for instance, adjacent to the continuous groove in the circuit board receiving the electronic enclosure edge. The adhesive is located so as to contact, or even cover or encapsulate, the plurality of surface-mount components of the circuit, so that when an attempt is made to separate the enclosure from the circuit board, one or more of the surface-mount components with break away from their respective contact or solder pads, due to the mechanical force applied, which in turn, breaks the electrical continuity of the tamper-respondent circuit and facilitates detection of the tamper event.

Generally stated, in one or more aspects, described further herein are tamper-respondent assemblies which include a circuit board and an electronic enclosure mounted to the circuit board to facilitate enclosing one or more electronic components within a secure volume. A tamper-respondent electronic circuit structure is provided to facilitate defining the secure volume. The tamper-respondent electronic circuit structure includes a tamper-respondent circuit, and an adhesive is provided securing, in part, the electronic enclosure to the circuit board. The adhesive contacts, at least in part, the tamper-respondent circuit of the tamper-respondent electronic circuit structure. Thus, an attempted separation of the electronic enclosure from the circuit board causes the adhesive to break the tamper-respondent circuit, thereby facilitating detection of the intrusion event. By way of example, the adhesive may cover or encapsulate, at least in part, one or more surface-mount components of the tamper-respondent circuit. The adhesive may be disposed over an upper surface of the circuit board along an inner periphery of the enclosure-to-board interface; that is, adjacent to where the electronic enclosure mounts to the circuit board.

In one or more implementations, the surface-mount components of the tamper-respondent circuit may include a plurality of surface-mount technology (SMT) resistors, such as a plurality of surface-mount, zero-ohm resistors, each mounted to respective pads on the surface of the circuit board at the inner periphery of the electronic enclosure. Note that the plurality of components (for instance, resistors) may be electrically connected in-series, and be mounted to an upper surface of the board within the area, encircled by the continuous groove. The adhesive may cover or encapsulate, at least in part, the plurality of components, and provide good adhesion to the components, so that an attempted separation of the electronic enclosure from the circuit board will damage the tamper-respondent circuit by breaking one or more of the surface-mount components from their respective contact pads. In addition, when disposed along the inner periphery of the electronic enclosure as described herein, the adhesive may also contact, in one or more embodiments, the inner sidewall tamper-respondent sensor of the tamper-respondent assembly disposed over the inner sidewall of the electronic enclosure, and bond that sensor directly to the circuit board for enhanced security. In one or more implementations, the tamper-respondent electronic circuit structure may further include a power source electrically connected to the monitor circuitry. In one or more aspects, the monitor circuitry is configured to identify an intrusion upon loss of power from the power source, and the tamper-respondent circuit is electrically connected between the power source and monitor circuitry, so that any damage to the tamper-respondent circuit results in loss of power, and thereby detection of the tamper event by the monitor circuitry.

As noted above, in one or more implementations, the circuit board may be or include a multilayer circuit board with one or more embedded tamper-respondent sensors. The embedded tamper-respondent sensor(s) facilitates defining, at least in part, the secure volume of the tamper-respondent assembly.

Further, the tamper-respondent assembly may include an encapsulant. This encapsulant is in addition to, for instance, a structural adhesive securing the electronic enclosure to the circuit board. Thus, an attempted attack at the interface of the electronic enclosure and multilayer circuit board would encounter, in an inward direction, two (or more) adhesives and/or encapsulants with different material properties. The encapsulant may be, or may comprise, an electrically conductive encapsulant and be disposed to facilitate electrical connection between the electronic enclosure and the circuit board, for instance, to electrically connect a conductive surface of the electronic enclosure to a ground plane of the circuit board. Advantageously, the electrically conductive encapsulant facilitates suppressing electromagnetic interference (EMI) at the enclosure-to-board interface.

In one or more other embodiments, a plurality of electrical contacts may alternatively be provided, for instance, between the circuit board and the electronic enclosure at the enclosure-to-board interface, or adjacent to the interface, so as to be spaced about the perimeter of the electronic enclosure where mounted to the circuit board. By way of example, the plurality of electrical contacts may be located to facilitate good electrical connection between the electronic enclosure and the circuit board to provide, for instance, suppression of electromagnetic interference (EMI) at the enclosure-to-board interface. For example, the plurality of electrical contacts may include a plurality of electromagnetic compatibility (EMC) springs disposed between the electronic enclosure and the circuit board at the perimeter of the electronic enclosure.

Figure 10:
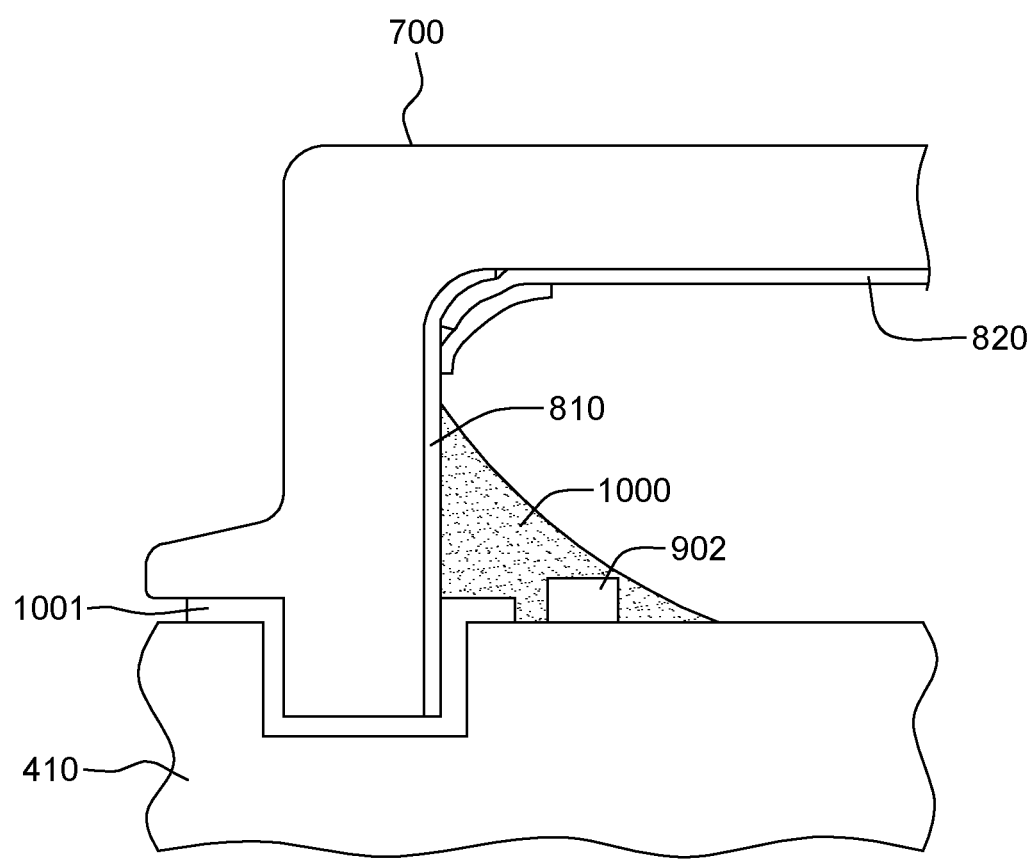
FIG. 10 is partial cross-sectional elevational view of one embodiment of a tamper-respondent assembly, such as depicted in FIGS. 4A & 9, shown with an adhesive securing the electronic enclosure to the circuit board at an inner periphery of the enclosure-to-board interface, and covering, at least in part, the tamper-respondent circuit, in accordance with one or more aspects of the present invention.

By way of example, FIGS. 9 & 10 depict a tamper-respondent assembly which comprises, for instance, multilayer circuit board 410 with a continuous groove or trench 412 configured and sized to receive an edge of electronic enclosure 700 when the enclosure is mounted to multilayer circuit board 410. Secure volume 401 is defined between, for instance, electronic enclosure 700 and multilayer circuit board 410 by a tamper-respondent electronic circuit structure, which may include, for instance, an inner sidewall tamper-respondent sensor 810 (FIG. 10), an inner main surface tamper-respondent sensor 820 (FIG. 10), and one or more embedded tamper-respondent sensors, such as described above.

As depicted in FIG. 9, the tamper-respondent assembly, and more particularly, the tamper-respondent electronic circuit structure of the assembly, further includes in one or more embodiments, a tamper-respondent circuit 900 disposed along the inside periphery of continuous groove 412, at the inner periphery of the enclosure-to-board interface (FIG. 10). By way of example, tamper-respondent circuit 900 includes circuit lines 901 which electrically interconnect, for instance, in series, a plurality of surface-mount components, such as resistors 902, which may be zero-ohm, surface-mount technology (SMT) resistors. By way of example, a zero-ohm resistor might comprise a surface-mount wire segment that is electrically connected at its ends to respective contact pads on the upper surface of the circuit board. The depicted ring of zero-ohm resistors, components or other structures, of tamper-respondent circuit 900 may, in one or more implementations, electrically connect 903 to monitor circuitry (not shown) of the tamper-respondent assembly disposed within secure volume 401. By locating tamper-respondent circuit 900, with the plurality of resistors 902 or other components, close to continuous groove 412, an adhesive 1000 may be applied to the inner surface of the electronic enclosure 700 and inner-sidewall tamper-respondent sensor 810 subassembly, so as to contact, and even cover, at least in part, the tamper-respondent circuit structure 900 with mounting of electronic enclosure 700 to circuit board 410. Note that adhesive 1000 may be the same or a different adhesive than structural adhesive 1001 used within continuous groove 412 to secure electronic enclosure 700 to multilayer circuit board 410. In one or more embodiments, adhesive 1000 and adhesive 1001 may be different adhesives with different material properties, which further facilitates providing enhanced protection against a chemical attack at the electronic enclosure 700 to multilayer circuit board 410 interface.

Note that the surface-mount components within tamper-respondent circuit 900 may comprise the same or different types of surface-mount components. Any component which provides structure for adhesive 1000 to affix to, and which may be broken away from respective contact pads of tamper-respondent circuit 900, may potentially be used, with zero-ohm resistors or wire segments being one type of component, presented by way of example only.

Advantageously, in one or more aspects, tamper-respondent circuit 900 may be electrically connected in-series between a power source and the monitor circuitry of the tamper-respondent assembly. In such a configuration, no additional power is required for monitoring tamper-respondent circuit 900 since the monitor circuitry already monitor for loss of power from the power source. Thus, any intrusion attempt which results in breaking or open-circuiting tamper-respondent circuit 900 is automatically detected as an intrusion event by the monitor circuitry through the loss of power. Thus, tamper intrusion detection is achieved without adding an additional sensing device, power comparator, etc., to the monitor circuitry, thereby further saving power. In one or more implementations, tamper-respondent circuit 900 may be disposed adjacent to continuous groove 412 in multilayer circuit board 410, as depicted in FIG. 9.

Figure 11:
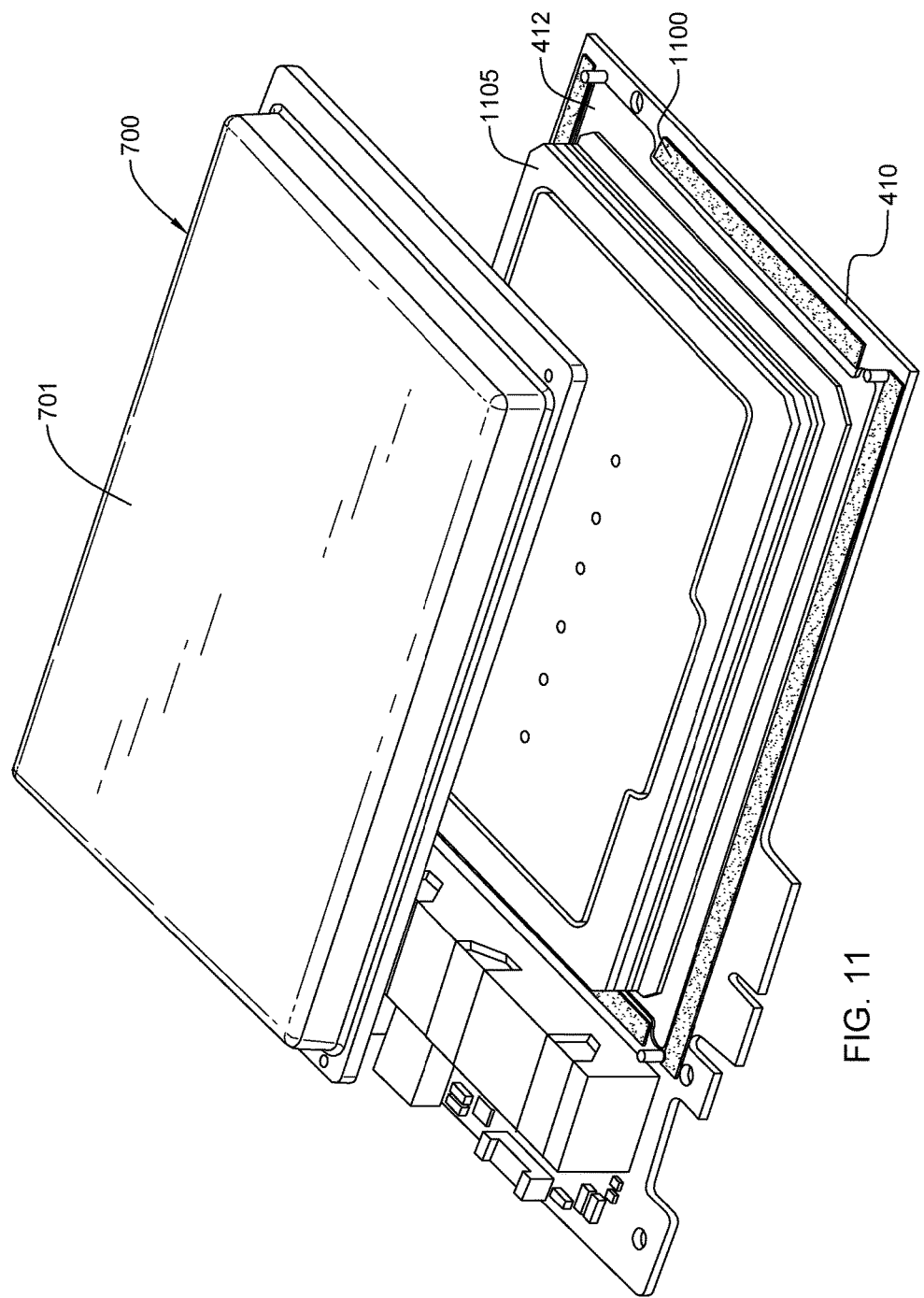
FIG. 11 is a partially exploded, isometric view of a tamper-respondent assembly, or tamper proof electronic package, which includes (in part) an electrically conductive encapsulant adjacent to a periphery of the enclosure-to-board interface, in accordance with one or more aspects of the present invention.
Figure 12:
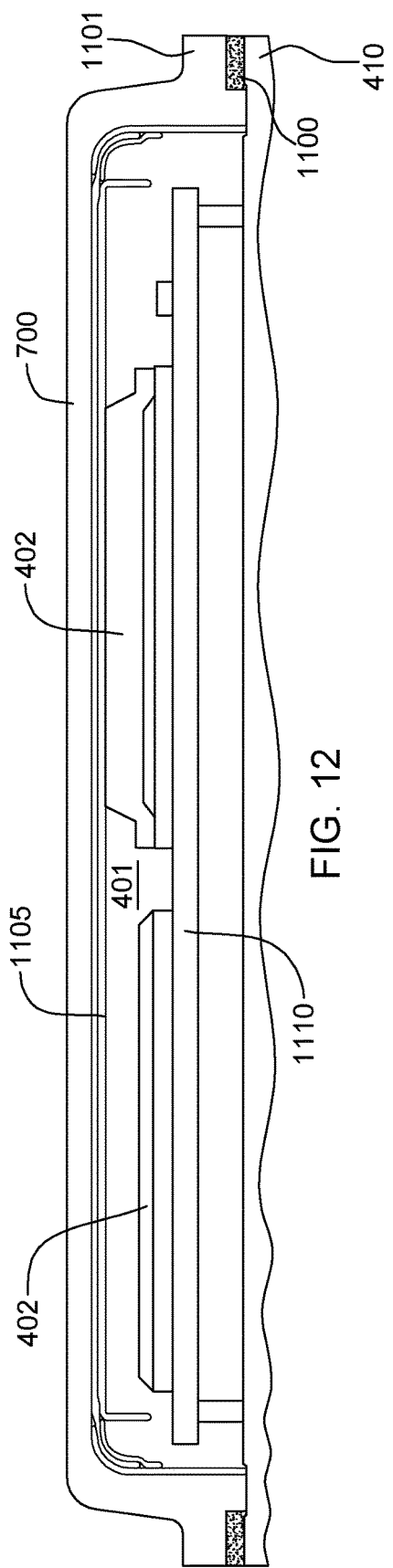
FIG. 12 is a cross-sectional elevational representation of one embodiment of a tamper-respondent assembly, such as depicted in FIG. 11, shown with the electronic enclosure secured to the circuit board, in accordance with one or more aspects of the present invention.
Figure 13:
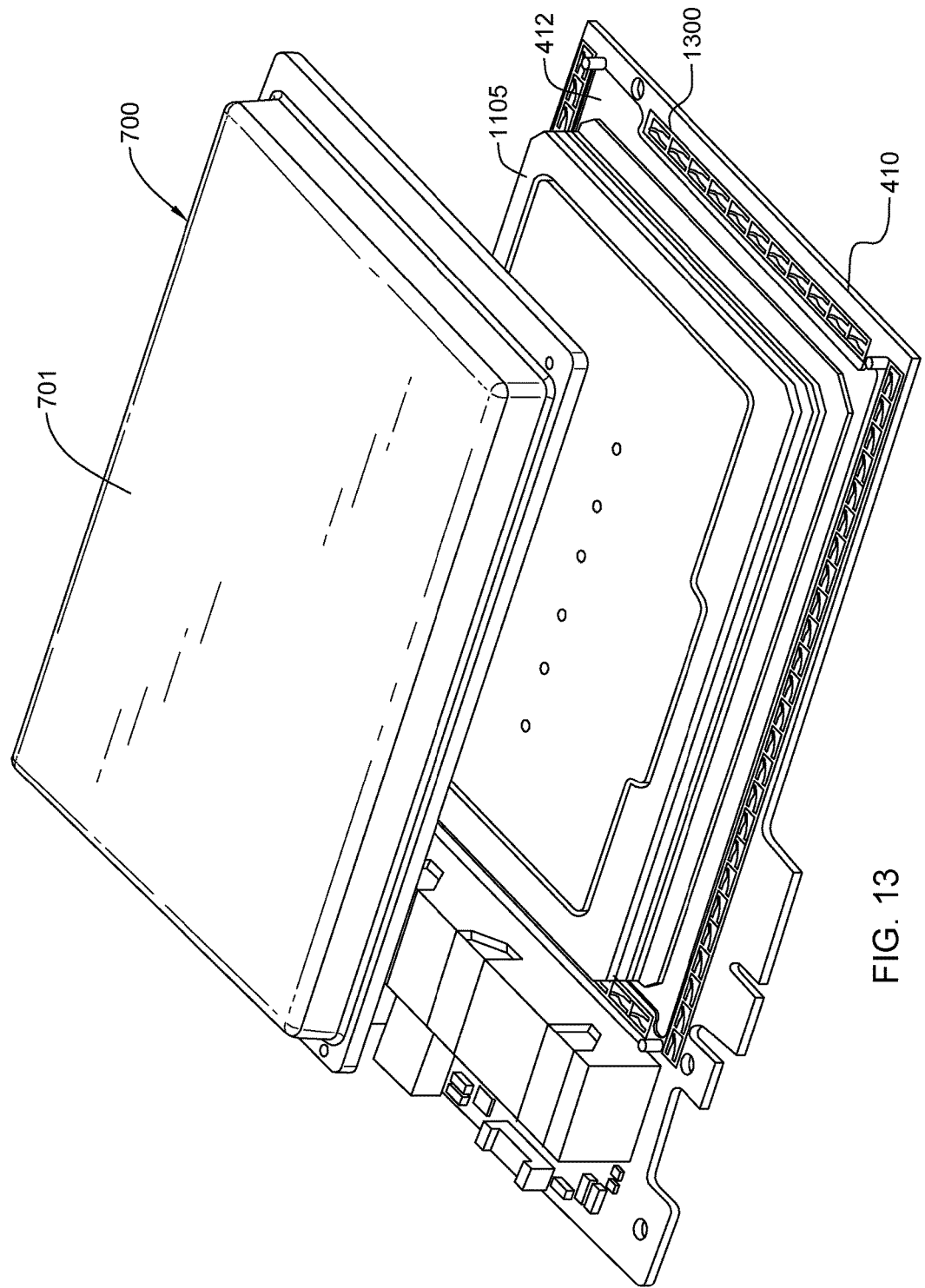
FIG. 13 is a partially exploded, isometric view of another embodiment of a tamper-respondent assembly, or tamper proof electronic package, which includes electromagnetic compatibility (EMC) springs disposed at a periphery of the enclosure-to-board interface, in accordance with one or more aspects of the present invention.
Figure 14:
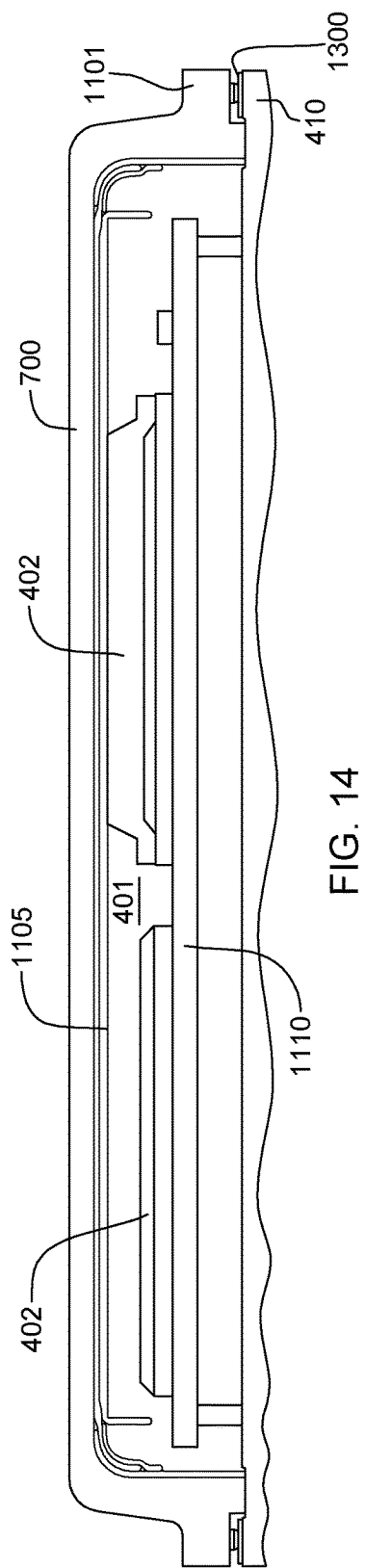
FIG. 14 is a cross-sectional elevational representation of one embodiment of a tamper-respondent assembly, such as depicted in FIG. 13, shown with the electronic enclosure mounted to the circuit board, in accordance with one or more aspects of the present invention.
Figure 15A:
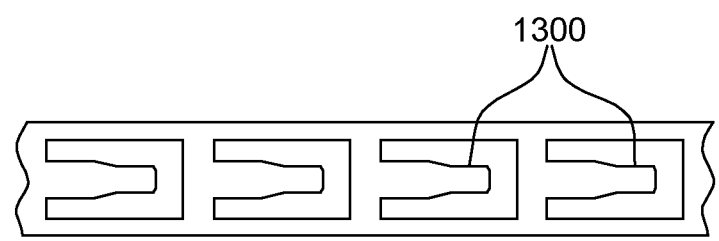
FIG. 15A is a partial top plan view of one embodiment of the EMC springs of FIGS. 13 & 14, which are configured and located to electrically connect the electronic enclosure to the circuit board, in accordance with one or more aspects of the present invention.
Figure 15B:
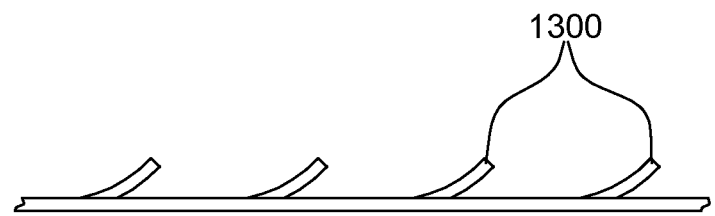
FIG. 15B is an elevational depiction of the EMC springs of FIG. 15A, in accordance with one or more aspects of the present invention.

FIGS. 11 & 12 depict a further enhanced tamper-respondent assembly, in accordance with one or more aspects of the present invention. This tamper-respondent assembly again includes, for instance, multilayer circuit board 410 with a continuous groove or trench 412 configured and sized to receive an edge of electronic enclosure 700 with mounting of the enclosure to multilayer circuit board 410. Secure volume 401 is defined, in part, inside the region encircled by circumferential groove 412, via a tamper-respondent electronic circuit structure, which may include, for instance, inner sidewall tamper-respondent sensor 810 (FIG. 10), inner main surface tamper-respondent sensor 820 (FIG. 10), and one or more embedded tamper-respondent sensors within multilayer circuit structure 410, such as described above. As illustrated, one or more electronic components 402 reside within secure volume 401, and may be mounted, by way of example, to a daughterboard 1110, or alternatively to circuit board 410. By way of example only, the one or more electronic components 402 may comprise monitor circuitry of the tamper-respondent electronic circuit structure, as well as, for instance, one or more encryption modules and/or decryption modules, and associated components. In one or more implementations, a heat spreader 1105 may be provided within the secure volume to facilitate conductive heat transfer from one or more electronic components 402 outwards to electronic enclosure 700. Heat spreader 1105 may be formed of any thermally conductive material, such as a metal.

Advantageously, in the depicted embodiment, an encapsulant 1100 is provided at the periphery of electronic enclosure 700 where coupled to multilayer circuit board 410. For instance, in one or more implementations, electronic enclosure 700 may include a circumferential extension or rim, denoted 1101, spaced above multilayer circuit board 410 when electronic enclosure 700 is mounted to multilayer circuit board 410, as illustrated in FIG. 12. An encapsulant 1100 is provided within a gap between circumferential extension 1101 and multilayer circuit board 410 to provide enhanced sealing at the enclosure-to-board interface. By way of example, encapsulant 1100 could comprise an electrically conductive encapsulant formed of different materials than the structural adhesive 1001 (FIG. 10) bonding electronic enclosure 700 to multilayer circuit board 410 and/or the adhesive 1000 employed about the inner perimeter of the electronic enclosure in a tamper-respondent assembly embodiment such as depicted in FIGS. 9 & 10. The electrically conductive encapsulant may be, in or more implementations, an EMI shielding product, such as available from Kemtron Limited of Braintree, Essex U.K. For instance, a Kemtron silicone-based RTV (SSA-RTV or SNG-RTV) conductive adhesive could be employed. Alternatively, an electrically conductive encapsulant such as Ablestik™ adhesive offered by Henkel Adhesives International of Rocky Hill, Conn. (USA), could be used. By way of specific example, Ablestik 965-IL might be employed within the gap between circumferential extension 1101 and multilayer circuit board 410. Advantageously, by providing encapsulant 1100 at the periphery, for example, at the outer periphery of the enclosure-to-board interface, an attempted intrusion in an inward direction at the interface, would necessarily have to progress through two or more different types of adhesives and/or encapsulants in-series. This advantageously further enhances security of the tamper-respondent assembly.

Those skilled in the art will note from the above description that the encapsulant 1100 provided as described above in connection with FIGS. 11 & 12, may be used in combination with the tamper-respondent assembly described above in connection with FIGS. 9 & 10, or separately. When used in combination, greater tamper-respondent security is provided at the enclosure-to-board interface. Note, in this regard, that the one or more electronic components 402 depicted in FIG. 12 could mount directly to the upper surface of multilayer circuit board 410. Alternatively, the monitor circuitry of the tamper-respondent assembly may be disposed between daughterboard 1110 and multilayer circuit board 410, which would facilitate, for instance, electrical connection between the above-described tamper-respondent circuit 900 of FIGS. 9 & 10 and the monitor circuitry.

FIGS. 13-15B depict a further embodiment of an electrical interface between electronic enclosure 700 and multilayer circuit board 410, which may be used, for instance, in combination with the tamper-respondent assembly described above in connection with FIGS. 9 & 10.

Referring collectively to FIGS. 13-15B, in this alternate configuration, the encapsulant 1100 of FIGS. 11 & 12 is replaced by a plurality of electrical contacts 1300, such as a plurality of electromagnetic compatibility (EMC) springs. In this configuration, the outer surface of electronic enclosure 700 is assumed to be electrically conductive, and the plurality of EMC springs are assumed to be electrically grounded to, for instance, one or more ground planes of multilayer circuit board 410, to provide electromagnetic interference shielding at the enclosure-to-board interface. Note that although providing shielding, this implementation does not provide the added benefit of the series coupled different types of adhesives of FIGS. 11 & 12. Either embodiment, however, could be employed in combination with the tamper-respondent assembly of FIGS. 9 & 10, if desired.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tamper-respondent assembly comprising:
   a circuit board;
   an enclosure adhesively secured to a surface of the circuit board via a first adhesive, the enclosure facilitating enclosing at least one electronic component within a secure volume;
   a tamper-respondent electronic circuit structure facilitating defining the secure volume, the tamper-respondent electronic circuit structure comprising a tamper-respondent circuit with at least one circuit line disposed on the surface of the circuit board and extending around an inner periphery of an enclosure-to-board interface where the enclosure mounts to the circuit board via the first adhesive; and
   a second adhesive securing, in part, the enclosure to the circuit board, the second adhesive being a different adhesive than the first adhesive, and covering, at least in part, the tamper-respondent circuit of the tamper-respondent electronic circuit structure, wherein the second adhesive is disposed, in part, on the surface of the circuit board at the inner periphery of the enclosure-to-board interface where the enclosure mounts to the circuit board, and the second adhesive extends around the inner periphery of the enclosure-to-board interface where the enclosure mounts to the circuit board, and separation of the electronic enclosure from the circuit board causes the second adhesive to break the tamper-respondent circuit, thereby facilitating detection of the separation.

2. The tamper-respondent assembly of claim 1, wherein the tamper-respondent electric circuit structure further comprises an inner-sidewall tamper-respondent sensor disposed over an inner sidewall of the enclosure, and facilitating defining the secure volume, the adhesive further contacting, at least in part, the inner-sidewall tamper-respondent sensor.

3. The tamper-respondent assembly of claim 1, wherein the tamper-respondent assembly further comprises an electrically conductive encapsulant, the electrically conductive encapsulant being disposed at the periphery of the enclosure-to-board interface, where the electronic enclosure mounts to the circuit board, to facilitate electrical connection between the enclosure and a ground plane of the circuit board.

4. The tamper-respondent assembly of claim 1, wherein the tamper-respondent assembly further comprises a plurality of electrical contacts between the circuit board and enclosure, and spaced about the periphery of the enclosure-to-board interface, where the enclosure mounts to the circuit board, the plurality of electrical contacts facilitating electrical connection of the electronic enclosure to the circuit board to suppress, at least in part, electromagnetic interference (EMI) at the enclosure-to-board interface.

5. The tamper-respondent assembly of claim 4, wherein the plurality of electrical contacts comprise a plurality of electromagnetic compatibility (EMC) springs disposed between the enclosure and the circuit board along the periphery of the enclosure-to-board interface.

6. The tamper-respondent assembly of claim 1, wherein the tamper-respondent electronic circuit structure further comprises a monitor circuit powered by a power source, the monitor circuit identifying an intrusion event upon loss of power from the power source, and wherein the tamper-respondent circuit electrically connects, at least in part, the power source to the monitor circuit so that breaking of the tamper-respondent circuit results in loss of power to the monitor circuit, and thereby detection of the intrusion event.

7. A tamper-respondent assembly comprising:
   a circuit board;
   at least one electronic component associated with the circuit board;
   an enclosure adhesively secured to a surface of the circuit board via a first adhesive, the enclosure facilitating enclosing at least one electronic component within a secure volume;
   a tamper-respondent electronic circuit structure facilitating defining the secure volume, the tamper-respondent electronic circuit structure comprising a tamper-respondent circuit with at least one circuit line disposed on the surface of the circuit board and extending around an inner periphery of an enclosure-to-board interface where the enclosure mounts to the circuit board via the first adhesive; and
   a second adhesive securing, in part, the enclosure to the circuit board, the second adhesive being a different adhesive than the first adhesive, and covering, at least in part, the tamper-respondent circuit of the tamper-respondent electronic circuit structure, wherein the second adhesive is disposed, in part, on the surface of the circuit board at the inner periphery of the enclosure-to-board interface where the enclosure mounts to the circuit board, and the second adhesive extends around the inner periphery of the enclosure-to-board interface where the enclosure mounts to the circuit board, and separation of the electronic enclosure from the circuit board causes the second adhesive to break the tamper-respondent circuit, thereby facilitating detection of the separation.

8. The tamper-respondent assembly of claim 7, wherein the circuit board includes a groove sized to receive an edge of the enclosure where the enclosure mounts to the circuit board, and wherein the tamper-respondent circuit is disposed on an upper surface of the circuit board within the secure volume at the inner periphery of the enclosure-to-board interface, where the enclosure mounts to the circuit board.

9. The tamper-respondent assembly of claim 7, wherein the tamper-respondent assembly further comprises an electrically conductive encapsulant, the electrically conductive encapsulant being disposed at the periphery of the enclosure-to-board interface, where the electronic enclosure mounts to the circuit board, to facilitate electrical connection between the enclosure and a ground plane of the circuit board.

10. The tamper-respondent assembly of claim 7, wherein the tamper-respondent assembly further comprises a plurality of electrical contacts between the circuit board and the enclosure, and spaced about the periphery of the enclosure-to-board interface, where the enclosure mounts to the circuit board, the plurality of electrical contacts facilitating electrical connection of the enclosure to the circuit board to suppress, at least in part, electromagnetic interference (EMI) at the enclosure-to-board interface.

11. The tamper-respondent assembly of claim 10, wherein the plurality of electrical contacts comprise a plurality of electromagnetic compatibility (EMC) springs disposed between the enclosure and the circuit board along the periphery of the enclosure-to-board interface.

12. The tamper-respondent assembly of claim 7, wherein the tamper-respondent electronic circuit structure further comprises a monitor circuit powered by a power source, the monitor circuit identifying an intrusion event upon loss of power from the power source, and wherein the tamper-respondent circuit electrically connects, at least in part, the power source to the monitor circuit so that breaking of the tamper-respondent circuit, and thereby detection of the intrusion event.

13. A fabrication method comprising:
    fabricating a tamper-respondent assembly, the fabricating comprising:
       providing a circuit board;
       providing an enclosure to adhesively secured to a surface of the circuit board via a first adhesive, the enclosure enclosing at least one electronic component within a secure volume;
       providing a tamper-respondent electronic circuit structure facilitating defining the secure volume, the tamper-respondent electronic circuit structure comprising a tamper-respondent circuit with at least one circuit line disposed on the surface of the circuit board and extending around an inner periphery of an enclosure-to-board interface where the enclosure mounts to the circuit board via the first adhesive; and
       providing a second adhesive securing, in part, the enclosure to the circuit board, the second adhesive being a different adhesive than the first adhesive, and covering, at least in part, the tamper-respondent circuit of the tamper-respondent electronic circuit structure, wherein the second adhesive is disposed, in part, on the surface of the circuit board at the inner periphery of the enclosure-to-board interface where the enclosure mounts to the circuit board, and the second adhesive extends around the inner periphery of the enclosure-to-board interface where the enclosure mounts to the circuit board, and separation of the electronic enclosure from the circuit board causes the second adhesive to break the tamper-respondent circuit, thereby facilitating detection of the separation.

* * * * *